US012342665B2

(12) United States Patent
Hirai et al.

(10) Patent No.: US 12,342,665 B2
(45) Date of Patent: Jun. 24, 2025

(54) LIGHT EMITTING DEVICE

(71) Applicant: NICHIA CORPORATION, Anan (JP)

(72) Inventors: Toshiyuki Hirai, Komatsushima (JP); Gentaro Tanaka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 336 days.

(21) Appl. No.: 17/811,143

(22) Filed: Jul. 7, 2022

(65) Prior Publication Data

US 2023/0026963 A1   Jan. 26, 2023

(30) Foreign Application Priority Data

Jul. 7, 2021   (JP) ................. 2021-112813

(51) Int. Cl.
*H10H 20/851* (2025.01)

(52) U.S. Cl.
CPC .............. *H10H 20/8513* (2025.01)

(58) Field of Classification Search
None
See application file for complete search history.

(56) References Cited

U.S. PATENT DOCUMENTS

| | | | |
|---|---|---|---|
| 9,276,180 B2 | 3/2016 | Ishida et al. | |
| 9,349,664 B2 | 5/2016 | Ishida et al. | |
| 10,374,132 B2 | 8/2019 | Kumano et al. | |
| 11,316,078 B2 | 4/2022 | Takaku et al. | |
| 11,319,486 B2 | 5/2022 | Kondo et al. | |
| 2014/0131753 A1 | 5/2014 | Ishida et al. | |
| 2015/0340577 A1 | 11/2015 | Ishida et al. | |
| 2017/0186920 A1 | 6/2017 | Kumano et al. | |
| 2020/0181487 A1 | 6/2020 | Kondo et al. | |
| 2020/0303597 A1 | 9/2020 | Takaku et al. | |
| 2021/0098659 A1* | 4/2021 | Iwasa | H01L 33/50 |
| 2021/0202802 A1 | 7/2021 | Bando et al. | |
| 2021/0391514 A1 | 12/2021 | Koyama et al. | |

FOREIGN PATENT DOCUMENTS

| | | |
|---|---|---|
| JP | 2006010388 A | 1/2006 |
| JP | 2014112635 A | 6/2014 |
| JP | 2014186882 A | 10/2014 |
| JP | 2017117912 A | 6/2017 |
| JP | 2018013670 A | 1/2018 |

(Continued)

*Primary Examiner* — Sarah K Salerno
(74) *Attorney, Agent, or Firm* — Hunton Andrews Kurth LLP

(57) ABSTRACT

Provided is a light emitting device, including a light emitting element having a light emission peak wavelength in a range of 380 nm or more and 500 nm or less, and a wavelength converting member including a ceramic composite including an inorganic fluorescent material having a light emission peak wavelength in a range of 510 nm or more and 570 nm or less and an inorganic oxide, and a translucent thin film having a physical film thickness in a range of 82 nm or more and 140 nm or less and a refractive index smaller than the refractive index of the ceramic composite, disposed on a light emission side of the ceramic composite, the translucent thin film including a fluoride containing at least one kind of an element selected from the group consisting of an alkali metal element, an alkaline earth metal element, and a Group 13 metal element.

4 Claims, 16 Drawing Sheets

(56) References Cited

FOREIGN PATENT DOCUMENTS

| JP | 2019066632 A | 4/2019 |
| JP | 2019085575 A | 6/2019 |
| JP | 2020090424 A | 6/2020 |
| JP | 2021106211 A | 7/2021 |
| WO | 2020080056 A1 | 4/2020 |

* cited by examiner

LIGHT EMITTING DEVICE

CROSS-REFERENCE TO RELATED PATENT APPLICATION

This application claims priority to Japanese Patent Application No. 2021-112813, filed on Jul. 7, 2021, the disclosure of which is hereby incorporated by reference in its entirety.

BACKGROUND

Technical Field

The present disclosure relates to a light emitting device.

Description of Related Art

A light emitting device including a light emitting diode (LED) or a laser diode (LD) and a wavelength converting member containing a fluorescent material that converts the wavelength of light emitted from the LED or LD has been known. The light emitting device of this type has been used as a light source for automobile use, general illumination use, a backlight of a liquid crystal display device, a projector. In this specification, the "fluorescent material" is used in the same meaning as a "fluorescent phosphor".

For example, Japanese Unexamined Patent Publication No. 2014-186882 describes a light emitting device including a fluorescent material formed of bulk crystals, in which heat of the fluorescent material is radiated via a heatsink. Japanese Unexamined Patent Publication No. 2014-186882 describes that an antireflection layer preventing reflection of excitation light is formed on the light incident plane of the fluorescent material of bulk crystals.

SUMMARY

A light emitting device using a ceramic composite including an inorganic fluorescent material and an inorganic oxide is demanded to emit light having a further higher light flux.

Under the circumstances, an object of embodiments of the present disclosure is to provide a light emitting device that emits light having a high light flux.

A first embodiment of the present disclosure relates to a light emitting device including a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material having a light emission peak wavelength in a range of 510 nm or more and 570 nm or less and an inorganic oxide, and
  a translucent thin film having a refractive index smaller than a refractive index of the ceramic composite, disposed on a light emission side of the ceramic composite,
  the translucent thin film being a single layer having a physical film thickness in a range of 82 nm or more and 140 nm or less,
  the translucent thin film including a fluoride containing at least one kind of an element selected from the group consisting of an alkali metal element, an alkaline earth metal element, and a Group 13 metal element.

A second embodiment of the present disclosure relates to a light emitting device including a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material and an inorganic oxide, and
  a translucent thin film having a refractive index smaller than a refractive index of the ceramic composite, disposed on a light emission side of the ceramic composite,
  the translucent thin film being a single layer including a fluoride containing at least one kind of an element selected from the group consisting of an alkali metal element, an alkaline earth metal element, and a Group 13 metal element,
  the translucent thin film having an L value calculated by the following expression (2), which is a ratio of a physical film thickness $L_1$ of the translucent thin film with respect to an optical film thickness $L_0$ of the translucent thin film calculated by the following expression (1), in a range of 0.82 or more and 1.41 or less:

$$L_0 = \text{light emission peak wavelength } (\lambda) \text{ (nm) of inorganic fluorescent material}/(4 \times \text{refractive index of translucent thin film}) \quad (1)$$

$$L = \text{physical film thickness } L_1 \text{ (nm) of translucent thin film}/L_0 \quad (2)$$

A third embodiment of the present disclosure relates to a light emitting device including a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material having a light emission peak wavelength in a range of 510 nm or more and 570 nm or less and an inorganic oxide, and
  a translucent thin film having a refractive index smaller than a refractive index of the ceramic composite, disposed on a light emission side of the ceramic composite,
  the translucent thin film being a single layer having a physical film thickness in a range of 250 nm or more and 330 nm or less,
  the translucent thin film including silicon dioxide or a fluoride, wherein the fluoride contains at least one kind of an element selected from the group consisting of an alkali metal element, an alkaline earth metal element, and a Group 13 metal element.

A fourth embodiment of the present disclosure relates to a light emitting device including a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material and an inorganic oxide, and a translucent thin film having a refractive index smaller than a refractive index of the ceramic composite, disposed on a light emission side of the ceramic composite, the translucent thin film being a single layer including silicon dioxide or a fluoride, wherein the fluoride contains at least one kind of an element selected from the group consisting of an alkali metal element, an alkaline earth metal element, and a Group 13 metal element, the translucent thin film having an L value calculated by the expression (2), which is a ratio of a physical film thickness $L_1$ of the translucent thin film with respect to an optical film thickness $L_0$ of the translucent thin film calculated by the expression (1), in a range of 2.5 or more and 3.5 or less.

A fifth embodiment of the present disclosure relates to a light emitting device including a light emitting element having a light emission peak wavelength in a range of 380 nm or more and 500 nm or less, and a wavelength converting member having a light emitting plane, disposed on a light emission side of the light emitting element, the wavelength converting member including a ceramic composite including an inorganic fluorescent material having a light emission peak wavelength in a range of 510 nm or more and 570 nm or less and an inorganic oxide, and a translucent thin film having a refractive index smaller than a refractive index of the ceramic composite, disposed on a light emission side of the ceramic composite, the translucent thin film including silicon dioxide or a fluoride, wherein the fluoride contains at least one kind of an element selected from the group consisting of an alkali metal element, an alkaline earth metal element, and a Group 13 metal element, the light emitting device emitting light satisfying at least one of a first transmittance difference T1 calculated based on the following expression (3) in a range of 0% or more and 25% or less and a second transmittance difference T2 calculated based on the following expression (4) in a range of −3% or more and 10% or less:

$$T1 = T_{C\text{-}60} - T_{P\text{-}60} - (T_{C\text{-}0} - T_{P\text{-}0}) \tag{3}$$

$$T2 = T_{C\text{-}30} - T_{P\text{-}60} - (T_{C\text{-}0} - T_{P\text{-}0}) \tag{4}$$

wherein in the expression (3), $T_{C\text{-}60}$ represents an average value of transmittances of transmitted light from the light emitting plane of the wavelength converting member at a light emission peak wavelength of the light emitting element at a directional angle of +600 and a directional angle of −60°, and $T_{P\text{-}60}$ represents an average value of transmittances of transmitted light from the light emitting plane of the wavelength converting member at a light emission peak wavelength of the inorganic fluorescent material at a directional angle of +60° and a directional angle of −60°; in the expression (4), $T_{C\text{-}30}$ represents an average value of transmittances of transmitted light from the light emitting plane of the wavelength converting member at a light emission peak wavelength of the light emitting element at a directional angle of +30° and a directional angle of −30°, and $T_{P\text{-}30}$ represents an average value of transmittances of transmitted light from the light emitting plane of the wavelength converting member at a light emission peak wavelength of the inorganic fluorescent material at a directional angle of +30° and a directional angle of −30°; and in the expressions (3) and (4), $T_{C\text{-}0}$ represents a transmittance of transmitted light from the light emitting plane of the wavelength converting member at a light emission peak wavelength of the light emitting element at a directional angle of 0°, and $T_{P\text{-}0}$ represents a transmittance of transmitted light from the light emitting plane of the wavelength converting member at a light emission peak wavelength of the inorganic fluorescent material at a directional angle of 0°, wherein a directional angle of 0° is an angle perpendicular to the light emitting plane, directional angles of +600 and −60° are angles inclined from the angle perpendicular to the light emitting plane toward the light emitting plane by +600 and −60°, respectively, with a directional angle of 0° as center, and directional angles of +300 and −30° are angles inclined from the angle perpendicular to the light emitting plane toward the light emitting plane by +300 and −30°, respectively, with a directional angle of 0° as center.

A sixth embodiment of the present disclosure relates to a light emitting device including a light emitting element having a light emission peak wavelength in a range of 380 nm or more and 500 nm or less, and a wavelength converting member having a light emitting plane, disposed on a light emission side of the light emitting element, the wavelength converting member including a ceramic composite including an inorganic fluorescent material having a light emission peak wavelength in a range of 510 nm or more and 570 nm or less and an inorganic oxide, and a translucent thin film having a refractive index smaller than a refractive index of the ceramic composite, disposed on a light emission side of the ceramic composite, the translucent thin film including at least two layers including: a first layer including silicon dioxide or a fluoride, wherein the fluoride contains at least one kind of an element selected from the group consisting of an alkali metal element, an alkaline earth metal element, and a Group 13 metal element; and a second layer including an oxide containing at least one kind selected from the group consisting of aluminum, niobium, tantalum, titanium, and zirconium, provided that in the case where the translucent thin film includes more than two layers, the first layer and the second layer are laminated alternately, the light emitting device emitting light satisfying a third transmittance difference T3 calculated based on the following expression (5) in a range of 0% or more and 20% or less:

$$T3 = T_{C\text{-}45} - T_{P\text{-}45} - (T_{C\text{-}0} - T_{P\text{-}0}) \tag{5}$$

wherein in the expression (5), $T_{C\text{-}45}$ represents an average value of transmittances of transmitted light from the light emitting plane of the wavelength converting member at a light emission peak wavelength of the light emitting element at a directional angle of +450 and a directional angle of −45°, and $T_{P\text{-}45}$ represents an average value of transmittances of transmitted light from the light emitting plane of the wavelength converting member at a light emission peak wavelength of the inorganic fluorescent material at a directional angle of +45° and a directional angle of −45°, and in the expression (5), $T_{C\text{-}0}$ represents a transmittance of transmitted light from the light emitting plane of the wavelength converting member at a light emission peak wavelength of the light emitting element at a directional angle of 0°, and $T_{P-0}$ represents a transmittance of transmitted light from the light emitting plane of the wavelength converting member at a light emission peak wavelength of the inorganic fluorescent material at a directional angle of 0°, wherein a directional angle of 0° is an angle perpendicular to the light emitting plane, and directional angles of +45° and −45° are angles inclined from the angle perpendicular to the light emitting plane toward the light emitting plane by +45° and −45°, respectively, with a directional angle of 0° as center.

A seventh embodiment of the present disclosure relates to a light emitting device including a light emitting element having a light emission peak wavelength in a range of 380 nm or more and 500 nm or less, and a wavelength converting member having a light emitting plane, disposed on a light emission side of the light emitting element, the wavelength converting member including a ceramic composite including an inorganic fluorescent material having a light emission peak wavelength in a range of 510 nm or more and 570 nm or less and an inorganic oxide, and a translucent thin film having a refractive index smaller than a refractive index of the ceramic composite, disposed on a light emission side of the ceramic composite, the translucent thin film being a single layer including silicon dioxide or a fluoride, wherein the fluoride contains at least one kind of an element selected from the group consisting of an alkali metal element, an alkaline earth metal element, and a Group 13 metal element, the light emitting device having an absolute value of a difference Δx of 0.012 or less between, in a chromaticity coordinate according to the CIE 1931 chromaticity diagram, an x coordinate $x_0$ of light emission color of the light emitting device at a directional angle of 0° and an x coordinate $x_{60}$, which is an average value of x coordinates of light emission color of the light emitting device at a directional angle of +60° and a directional angle of −60°, which are angles inclined from an angle perpendicular to the light emitting plane toward the light emitting plane by +60° and −60°, respectively, with a directional angle of 0° as center.

According to some embodiments of the present disclosure, a light emitting device that emits light having a high light flux can be provided.

DETAILED DESCRIPTION

The light emitting device will be described with reference to embodiments below. The embodiments shown below are examples for practicing the technical concept of the present invention, and the present invention is not limited to the following light emitting devices. The relationship between color names and chromaticity coordinates and the relationship between wavelength ranges of light and color names of monochromatic light are in accordance with JIS Z8110.

Light Emitting Device

The light emitting device includes a light emitting element having a light emission peak wavelength in a range of 380 nm or more and 500 nm or less, and a wavelength converting member having a light emitting plane, disposed on a light emission side of the light emitting element, and the wavelength converting member includes a ceramic composite including an inorganic fluorescent material and an inorganic oxide, and a translucent thin film having a refractive index smaller than a refractive index of the ceramic composite, disposed on the emission side of light of the ceramic composite. One example of the light emitting device will be described below.

Figure 1:
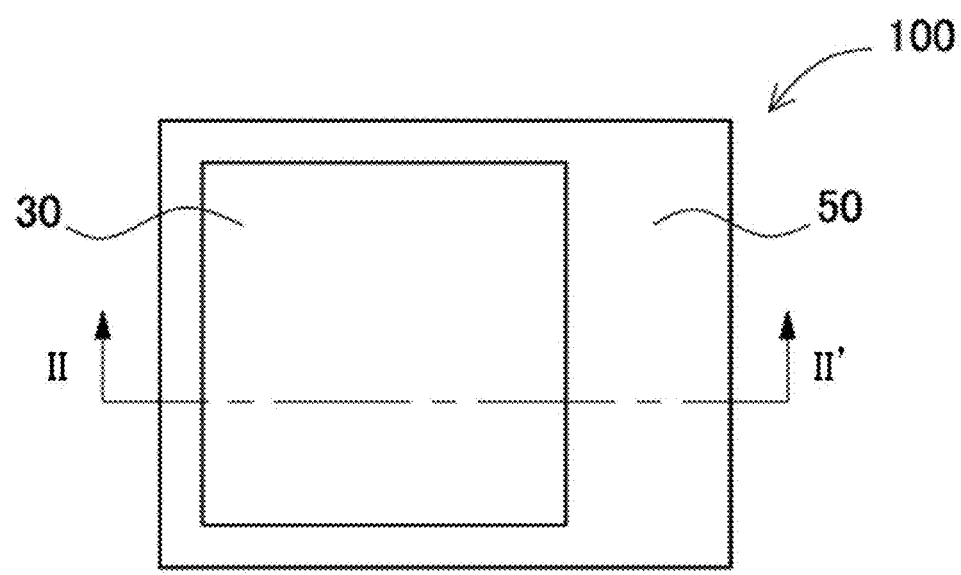
FIG. 1 is a schematic plan view showing an exemplary light emitting device.
Figure 2:
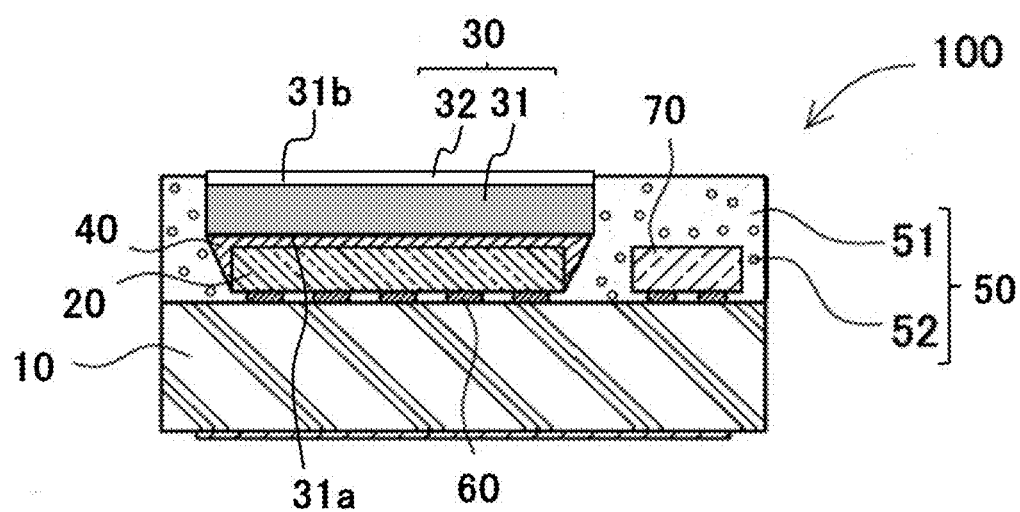
FIG. 2 is a schematic cross sectional view showing the exemplary light emitting device.

FIG. 1 shows one example of the light emitting device and is a schematic plan view of a light emitting device 100, and FIG. 2 is a schematic cross sectional view of the light emitting device 100 shown in FIG. 1 on the line II-II'. The light emitting device 100 includes a light emitting element 20 formed of LED or LD, and a wavelength converting member 30 including a ceramic composite 31 emitting light through excitation with light from the light emitting element 20 and a translucent thin film 32 disposed on the emission side of light of the ceramic composite 31. The light emitting element 20 is flip chip mounted on a substrate 10 via bumps as a conductive member 60. The wavelength converting member 30 includes the ceramic composite 31 that is provided on a light emitting plane of the light emitting element 20 via an adhesive layer 40. The ceramic composite 31 has an incident plane 31a, on which light from the side of the light emitting element 20 is incident, and the side thereof on the translucent thin film 32 constitutes an emission plane 31b. the translucent thin film 32 is disposed on the emission side of the ceramic composite 31. The side surfaces of the light emitting element 20 and the wavelength converting member 30 are covered with a covering member 50 reflecting light. The light emitting element 20 is supplied with electric power from the outside of the light emitting device 100 via wiring and the conductive member 60 formed on the substrate 10, and thereby the light emitting device 100 can emit light. The light emitting device 100 may include a semiconductor element 70, such as a protective element for preventing breakage of the light emitting element 20 due to the application of an excessive voltage. The covering member 50 may be formed, for example, to cover the semiconductor element 70. The covering member 50 may contain a resin 51 and at least one kind of an additive 52 selected from the group consisting of a colorant, a fluorescent material, and a filler. The members used in the light emitting device will be described below. For the details thereof, reference may be made, for example, to the description in Japanese Unexamined Patent Publication No. 2014-112635 A.

Light Emitting Element

The light emitting element may be, for example, an LED chip or an LD chip, which is a semiconductor light emitting element using a nitride semiconductor.

The light emitting element preferably has a light emission peak wavelength in a range of 380 nm or more and 500 nm or less, more preferably has a light emission peak wavelength in a range of 390 nm or more and 495 nm or less, further preferably has a light emission peak wavelength in a range of 400 nm or more and 490 nm or less, and particularly preferably has a light emission peak wavelength in a range of 420 nm or more and 490 nm or less. The light emitting element has a p-electrode and an n-electrode. The p-electrode and the n-electrode of the light emitting element may be formed on the same plane of the light emitting element or may be provided on different planes thereof. The light emitting element may be flip chip mounted.

Wavelength Converting Member

Ceramic Composite

The ceramic composite includes an inorganic fluorescent material and an inorganic oxide.

The inorganic fluorescent material emits fluorescent light having a light emission peak wavelength in a range of 510 nm or more and 570 nm or less with light from the light emitting element having a light emission peak wavelength in a range of 380 nm or more and 500 nm or less.

Inorganic Fluorescent Material

It suffices that the inorganic fluorescent material emits fluorescent light having a light emission peak wavelength in a range of 510 nm or more and 570 nm or less, and the inorganic fluorescent material preferably contains at least one kind of a fluorescent material selected from the group consisting of a rare earth aluminate fluorescent material, a silicate fluorescent material, and a β-SiAlON fluorescent material, and more preferably contains a rare earth aluminate fluorescent material.

The rare earth aluminate fluorescent material preferably has a composition represented by the following formula (I).

$$(Ln^1_{1-a}Ce_a)_3(Al_cGa_b)_5O_{12} \quad (I)$$

In the formula (I), $Ln^1$ represents at least one kind of a first rare earth element selected from the group consisting of Y, Gd, Lu, and Tb, and a, b, and c represent numbers satisfying $0 \leq a \leq 0.22$, $0 \leq b \leq 0.4$, $0 \leq c \leq 1.1$, and $0.9 \leq b+c \leq 1.1$.

The first rare earth element $Ln^1$ contained in the rare earth aluminate fluorescent material may contain two or more kinds of elements selected from the group consisting of Y, Gd, Lu, and Tb. The first rare earth element $Ln^1$ may be at least one kind selected from the group consisting of Y, Lu, and Gd. The first rare earth element $Ln^1$ may be Y and Gd, and may be Y and Lu. In the case where the rare earth aluminate fluorescent material contains two or more kinds of the first rare earth elements $Ln^1$, and the first rare earth element $Ln^1$ is Y and Gd, the molar ratio of Y and Gd (Y:Gd) in the composition of the rare earth aluminate fluorescent material is preferably in a range of 99.5:0.5 to 70:30, may be in a range of 99:1 to 80:20, and may be in a range of 99:1 to 90:10.

The silicate fluorescent material preferably has a composition represented by the following formula (II).

$$Ca_dEu_eMg_fSi_4O_gCl_h \quad (II)$$

In the formula (II), d, e, f, g, and h represent numbers satisfying $7.0 \leq d \leq 7.94$, $0.01 \leq e \leq 1.0$, $7.70 \leq d+e \leq 7.95$, $0.9 \leq f \leq 1.1$, $15.6 \leq g \leq 16.1$, and $1.90 \leq h \leq 2.00$.

The β-SiAlON fluorescent material preferably has a composition represented by the following formula (III).

$$Si_{6-z}Al_zO_zN_{8-z}:Eu \ (0<z\leq 4.2) \quad (III)$$

Inorganic Oxide

The inorganic oxide contains at least Al, and may contain at least one kind of a second rare earth element $Ln^2$ selected from the group consisting of Y, Gd, Tb, and Lu. Examples of the inorganic oxide as a raw material constituting the ceramic composite include aluminum oxide ($Al_2O_3$), yttrium oxide ($Y_2O_3$), gadolinium oxide ($Gd_2O_3$), terbium oxide ($Tb_4O_7$), and lutetium oxide ($Lu_2O_3$). The inorganic oxide may be a composite oxide containing at least one kind of the second rare earth element $Ln^2$ selected from the group consisting of Y, Gd, Tb, and Lu and an element other than the second rare earth element $Ln^2$. Examples of the composite oxide include yttrium aluminum perovskite ($YAlO_3$: YAP) and yttrium aluminum garnet ($Y_3Al_5O_{12}$: YAG).

The content of the inorganic fluorescent material in the ceramic composite may be, for example, in a range of 5% by mass or more and 98% by mass or less, and may be in a range of 10% by mass or more and 95% by mass or less, based on the total amount of the ceramic composite. It suffices that the content of the inorganic fluorescent material contained in the ceramic composite is such an amount that provides light having a target light emission peak wavelength.

The thickness of the ceramic composite may be in a range of 50 μm or more and 500 μm or less, may be in a range of 60 μm or more and 450 μm or less, and may be in a range of 70 μm or more and 400 μm or less. It suffices that the size of the ceramic composite used as the wavelength converting member is such a size that covers the entire light extraction plane of the light emitting element.

A refractive index r1 of the ceramic composite is preferably in a range of 1.76 or more and 1.85 or less, and may be in a range of 1.77 or more and 1.83 or less. In the case where the refractive index r1 of the ceramic composite is in the range, the installation of the translucent thin film having a refractive index smaller than the refractive index of the ceramic composite on the emission side of light can reduce the reflection in the wavelength converting member, and can enhance the light flux of the light emitting device. In the case where the inorganic fluorescent material contained in the ceramic composite is a rare earth aluminate fluorescent material, the refractive index r1 of the ceramic composite can be set in a range of 1.76 or more and 1.85 or less.

The refractive index r1 of the ceramic composite can be calculated from the sum of the product of the content of the inorganic fluorescent material in the ceramic composite and the refractive index of the inorganic fluorescent material, and the product of the content of the inorganic oxide in the ceramic composite and the refractive index of the inorganic oxide. Specifically, the refractive index r1 can be obtained according to the following expression (6). In the case where the ceramic composite contains two or more kinds of the inorganic oxides, the refractive index of the ceramic composite can be obtained from the contents of the inorganic oxides and the refractive indices of the inorganic oxides.

Refractive index $r1$ of ceramic composite=(content of inorganic fluorescent material (% by volume)×refractive index of inorganic fluorescent material)+(content of inorganic oxide (% by volume)×(refractive index of inorganic oxide) (6)

The content of the inorganic fluorescent material in terms of volume ratio in the ceramic composite can be obtained according to the following expressions (7) and (8). The content of the inorganic oxide in terms of volume ratio in the ceramic composite can be obtained according to the following expression (9).

Total volume of ceramic composite=(content of inorganic fluorescent material (% by mass)/true density of inorganic fluorescent material)+(content of inorganic oxide (% by mass)/true density of inorganic oxide)×100 (7)

Content of inorganic fluorescent material (% by mass)=((content of inorganic fluorescent material (% by mass)/true density of inorganic fluorescent material)/total volume of ceramic composite)×100 (8)

Content of inorganic oxide (% by volume)=100−content of inorganic fluorescent material (% by volume) (9)

Production Method of Ceramic Composite

The ceramic composite can be produced in such a manner that a raw material mixture obtained by mixing the inorganic fluorescent material and the inorganic oxide is molded by a press molding method, such as mold press and/or cold isostatic press (CIP), the resulting molded article is primarily baked to provide a sintered article, and depending on necessity, the sintered article is secondarily baked by hot isostatic press (HIP). An annealing treatment may be performed after the secondary baking. The temperature of the primary baking of the molded article may be in a range of 1,550° C. or more and 2,000° C. or less. The temperature of the secondary baking of the sintered article may be in a range of 1,500° C. or more and 2,000° C. or less. The temperature of the annealing treatment may be a temperature that is lower than the baking temperatures of the primary baking and the secondary baking and is in a range of 1,000° C. or more and 1,500° C. or less. For the details of the production method of the ceramic composite, reference may be made to the description of Japanese Patent Application No. 2020-113289.

Translucent Thin Film

The translucent thin film is disposed on the emission side of light of the ceramic composite, and has a refractive index smaller than the refractive index of the ceramic composite.

The light emitting device of the first embodiment includes the wavelength converting member including the translucent thin film that is a single layer having a physical film thickness $L_1$ in a range of 82 nm or more and 140 nm or less. In the case where the wavelength converting member includes the translucent thin film that is a single layer having a physical film thickness $L_1$ in a range of 82 nm or more and 140 nm or less on the emission side of light of the ceramic composite, the reflection of light at the interface between the ceramic composite and the translucent thin film is cancelled out by the reflection of light at the interface between the translucent thin film and the air, so as to reduce the reflection at the interfaces, and thereby the light emitting device emits light having a high light flux. The physical film thickness $L_1$ of the translucent thin film may be in a range of 83 nm or more and 130 nm or less, may be in a range of 84 nm or more and 125 nm or less, and may be in a range of 85 nm or more and 123 nm or less. The light emitting device of the first embodiment may include a translucent thin film having an L value described later in a range of 0.82 or more and 1.41 or less.

The translucent thin film includes a fluoride containing at least one kind of an element selected from the group consisting of an alkali metal element, an alkaline earth metal element, and a Group 13 metal element. Examples of the fluoride include $MgF_2$, $CaF_2$, $SrF_2$, $AlF_3$, $Na_3AlF_6$, $Na_5Al_3F_{14}$, LiF, NaF, KF, and combinations thereof. The fluoride preferably contains at least one kind selected from the group consisting of $MgF_2$, $CaF_2$, $SrF_2$, $AlF_3$, $Na_3AlF_6$, $Na_5Al_3F_{14}$, NaF, and LiF. The translucent thin film may include silicon dioxide ($SiO_2$).

Figure 3:
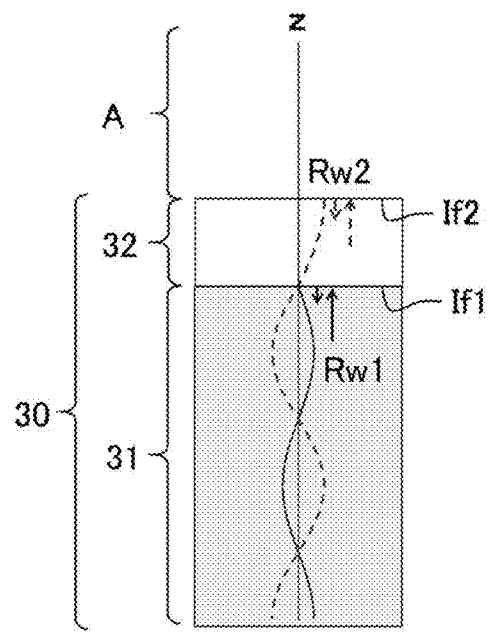
FIG. 3 is a conceptual diagram showing a schematic enlarged view of a part of an exemplary wavelength converting member.

The reflection of light emitted from the light emitting device will be described with reference to FIG. 3. FIG. 3 is a conceptual diagram showing a schematic enlarged view of a part of the wavelength converting member of the light emitting device. The wavelength converting member 30 includes the ceramic composite 31 and the translucent thin film 32. The light emitted from the light emitting device is firstly reflected by a first interface If1 between the ceramic composite 31 and the translucent thin film 32 to be a first reflected wave Rw1 as a sine wave having a first cycle. The light emitted from the light emitting device is secondly reflected by a second interface If2 between the translucent thin film 32 and air A to be a second reflected wave Rw2 as a sine wave having a second cycle. A refractive index r2 of the translucent thin film 32 is smaller than the refractive index r1 of the ceramic composite 31, and therefore the phase of the second reflected wave Rw2 is opposite to the phase of the first reflected wave Rw1. In synthesizing the first reflected wave Rw1 and the second reflected wave Rw2 having phases opposite to each other, the first reflected wave Rw1 and the second reflected wave Rw2 are cancelled out by each other to reduce the reflection in the wavelength converting member 30, and thereby the light emitting device can emit light having a higher light flux. In FIG. 3, z represents the light axis.

The light emitting device of the second embodiment includes the wavelength converting member including the translucent thin film that is a single layer including a fluoride, and the translucent thin film has an L value calculated by the following expression (2), which is the ratio of the physical film thickness $L_1$ of the translucent thin film with respect to an optical film thickness $L_0$ of the translucent thin film calculated by the following expression (1), in a range of 0.82 or more and 1.41 or less. The light emitting device of the second embodiment may include a translucent thin film that is a single layer including a fluoride having a physical film thickness $L_1$ of 82 nm or more and 140 nm or less. A film thickness of a transparent thin film generally means an optical film thickness (see, for example, Mitsunobu Kobiyama, "Kogaku no Kiso Riron—Fresnel Keisu and Tokusei Matrix" (Basic Theories of Optics—Fresnel Coefficient and Characteristic Matrix-), published by Optronics Co., Ltd., February 25, Heisei 23 (2011), enlarged and revised edition, first copy, p. 21). In the description herein, the optical film thickness $L_0$ of the translucent thin film means a value that is calculated by the following expression (1), and the physical film thickness $L_1$ of the translucent thin film means a thickness that is measured with a cross sectional SEM image of the translucent thin film.

$L_0$=light emission peak wavelength ($\lambda$) (nm) of inorganic fluorescent material/(4×refractive index of translucent thin film)  (1)

$L$=physical film thickness $L_1$ (nm) of translucent thin film/$L_0$  (2)

The optical film thickness $L_0$ of the translucent thin film is a value (nm) obtained by dividing the light emission peak wavelength ($\lambda$) of the inorganic fluorescent material, which is the wavelength of light emitted from the translucent thin film, by the product of 4, which is the value in consideration of the phase where the displacement (i.e., the height of the wave) of the second reflected wave Rw2 reflected at the second interface between the translucent thin film and the air becomes maximum (or minimum), and the refractive index of the translucent thin film. In the expression (1), the refractive index of the translucent thin film is assumed to be the refractive index of the raw material constituting the translucent thin film. For example, in the case where the translucent thin film is formed of magnesium fluoride, the refractive index of magnesium fluoride, 1.38, is used as the refractive index of the translucent thin film. For example, furthermore, in the case where the translucent thin film is formed of silicon dioxide, the refractive index of silicon dioxide, 1.47, is used as the refractive index of the translucent thin film.

The L value calculated by the expression (2) is the ratio ($L_1/L_0$) of the physical film thickness $L_1$ (nm) of the translucent thin film and the optical film thickness $L_0$ (nm) of the translucent thin film calculated by the expression (1). In the case where the L value calculated by the expression (2) comes close to 1.0, the phases of the second reflected wave Rw2 generated at the interface between the translucent thin film and the air and the first reflected wave Rw1 generated at the interface between the ceramic composite and the translucent thin film come close to phases opposite to each other as shown in FIG. 3, and thereby the effect of cancelling out the first reflected wave Rw1 and the second reflected wave Rw2 by each other can be enhanced to reduce the reflection in the wavelength converting member, resulting in light having a higher light flux emitted by the light emitting device. The translucent thin film provided in the light emitting device preferably has an L value in a range of 0.82 or more and 1.41 or less, more preferably in a range of 0.82 or more and 1.4 or less, further preferably in a range of 0.85 or more and 1.3 or less, and still further preferably in a range of 0.9 or more and 1.2 or less, for emitting light having a high light flux.

The light emitting device of the third embodiment includes the wavelength converting member including the translucent thin film that is a single layer including a fluoride or silicon dioxide, and has a physical film thickness $L_1$ in a range of 250 nm or more and 330 nm or less. In the case where the wavelength converting member has the translucent thin film that is a single layer having a physical film thickness $L_1$ in a range of 250 nm or more and 330 nm or less on the emission side of light of the ceramic composite, the change in chromaticity depending on the directional angle can be reduced to improve the directional chromaticity characteristics. In the description herein, the case where the light emitting device is viewed in the normal direction, i.e., viewed in the direction perpendicular to the light emitting plane of the wavelength converting member, which is the light emitting plane of the light emitting device, is referred to as a directional angle of 0°. The direction of a directional angle of 0° is the direction in parallel to the light axis of the light emitting device. An angle inclined from a directional angle of 0° toward the direction which is horizontal to the light emitting plane of the light emitting device is referred to as a directional angle of 0 degree. The chromaticity of the light emission color per directional angles may be referred to as a "directional chromaticity" in some cases. The chromaticity means the value of the x coordinate (which may also be referred to as an "x value") and the value of the y coordinate (which may also be referred to as a "y value") in the chromaticity coordinate on the CIE (Commission intaernationale de l'Eclairage (International Commission on Illumination)) 1931 chromaticity diagram. The difference in directional chromaticity per directional angles may be referred to as "directional chromaticity characteristics" in some cases. The chromaticity coordinate on the CIE chromaticity diagram at a directional angle of 0° may be shown as a chromaticity coordinate $(x_0,y_0)$, and the average value of the x coordinate and the average value of the y coordinate of the light emission color by the change of the directional angle of +0 degree and the directional angle of −θ degree may be shown as a directional chromaticity coordinate $(x_\theta,y_\theta)$, in some cases. The specific values of +θ degree and −θ degree are any of +30° and −30°, +45° and −45°, and +60° and −60°, respectively. The case where the "directional chromaticity characteristics are good" means that a difference $\Delta x$ (absolute value) between an x coordinate $x_0$ at a directional angle of 0° and a directional chromaticity coordinate $x_\theta$ at a directional angle of $\theta$ degree (which may also be referred to as a "difference $\Delta x$ of the directional chromaticity") is small, and the change in chromaticity is small even through the directional angle is changed. In the case where the "directional chromaticity characteristics are good", a difference $\Delta y$ (absolute value) between a y coordinate $y_0$ at a directional angle of 0° and a directional chromaticity coordinate $y_\theta$ at a directional angle of $\theta$ degree (which may also be referred to as a "difference $\Delta y$ of the directional chromaticity") is also preferably small. The case where the "directional chromaticity characteristics are not good" means that the value of the difference $\Delta x$ of the directional chromaticity of the light emission color by the change in directional angle is large, and the chromaticity is changed by the change in directional angle. The physical film thickness $L_1$ of the translucent thin film may be in a range of 250 nm or more and 330 nm or less, may be in a range of 250 nm or more and 320 nm or less, and may be in a range of 260 nm or more and 320 nm or less, for improving the directional chromaticity characteristics. The light emitting device of the third embodiment may include a translucent thin film having an L value described later in a range of 2.5 or more and 3.5 or less.

Figure 4:
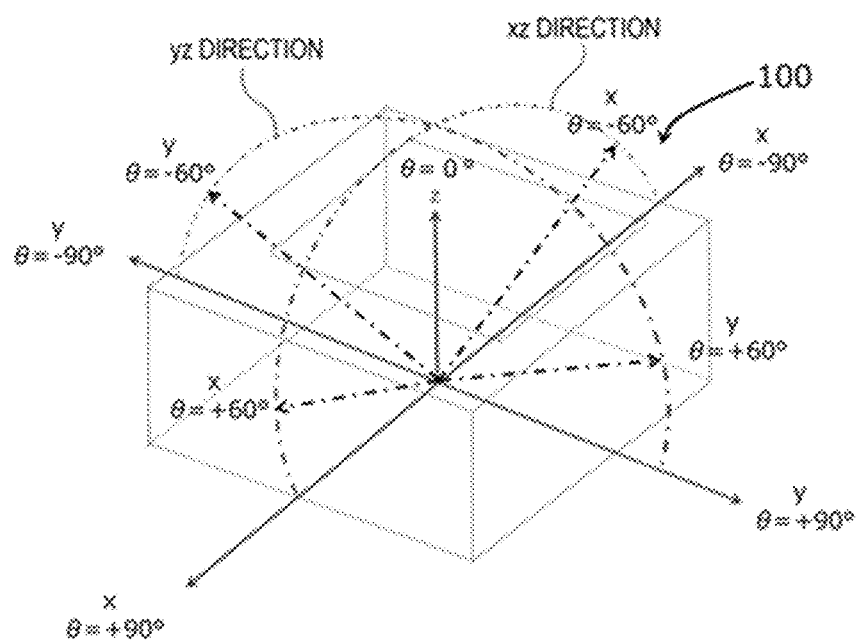
FIG. 4 is a conceptual diagram showing directional angles of the exemplary light emitting device.

FIG. 4 is a conceptual diagram showing the directional angles of the light emitting device 100. In the case where the light emitting device 100 is viewed in the normal direction, i.e., viewed in the direction of a directional angle of 0° (i.e., $\theta=0°$ in FIG. 4) in parallel to the light axis z, the light emitting device 100 has a tendency that light in a range of 380 nm or more and 500 nm or less, in which the light emission peak wavelength of the light emitting element exists, is readily emitted from the light emitting plane of the light emitting device. On the other hand, in the case where the angle inclined toward the direction horizontal to the light emitting plane of the light emitting device is increased, i.e., the directional angle comes close to a directional angle of +90° (i.e., $\theta=+90°$ in FIG. 4) or a directional angle of −90° (i.e., $0=−90°$ in FIG. 4), the light emitting device 100 has a tendency that light in a range of 510 nm or more and 570 nm or less, in which the light emission peak wavelength of the inorganic fluorescent material exists, is readily emitted. The directional angle of +$\theta$ degree (+$\theta$°) is an angle inclined from a directional angle of 0° as center toward the direction horizontal to the light emitting plane of the light emitting device by 0 degree, and the directional angle of −$\theta$ degree (−$\theta$°) is an angle inclined toward the direction horizontal to the light emitting plane of the light emitting device by 0 degree on the side line-symmetrically opposite to the directional angle of +0 degree (+0°) with respect to a directional angle of 0° as center.

The light emitting device includes the wavelength converting member including the translucent thin film that is a single layer comprising or formed of a fluoride or silicon dioxide, and in the case where the translucent thin film satisfies the particular condition, in the direction of a directional angle of 0° (i.e., $\theta=0°$ in FIG. 4) in parallel to the light axis z, the transmittance of the emitted light of the inorganic fluorescent material (for example, the emitted light having a light emission peak wavelength around 550 nm) is higher than the emitted light of the light emitting element (for example, the emitted light having a light emission peak wavelength around 450 nm). The transmittance of the wavelength converting member becomes higher than the case where the wavelength converting member does not include the translucent thin film, and the transmission of the emitted light of the inorganic fluorescent material included in the wavelength converting member through the translucent thin film is further enhanced. Furthermore, there is a tendency that the emitted light of the inorganic fluorescent material in the case where the wavelength converting member includes the translucent thin film is readily emitted in the direction of a directional angle of 0° (i.e., $\theta=0°$ in FIG. 4) as compared to the emitted light of the inorganic fluorescent material in the case where the wavelength converting member does not include the translucent thin film.

Figure 5:
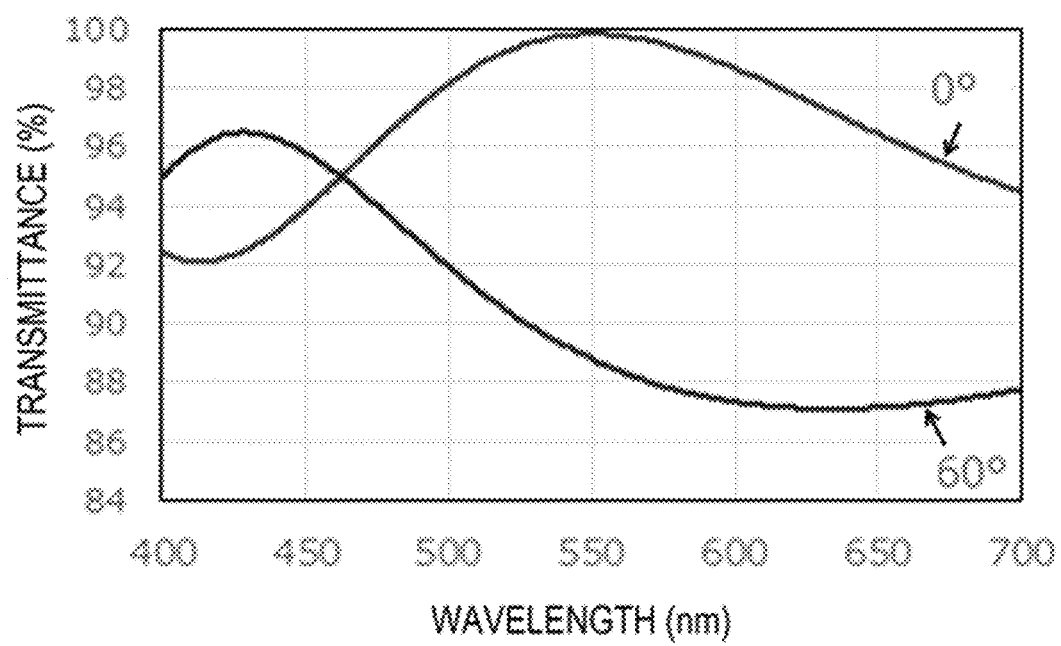
FIG. 5 is a graph showing an exemplary relationship of the transmittance with respect to the wavelength of light transmitted through an exemplary translucent thin film at a directional angle of 0° and a directional angle of +600 or a directional angle of −60° of an exemplary light emitting device including the translucent thin film.

FIG. 5 is a graph showing the transmittance in the case where the wavelength converting member includes the particular translucent thin film. As shown in FIG. 5, in the case where the directional angle is 0°, and the wavelength converting member includes the particular translucent thin film, in a region exceeding a wavelength of 470 nm, the transmittance of the wavelength converting member including the translucent thin film becomes higher than the case where the directional angle is +600 or −60°, and the emitted light of the inorganic fluorescent material is readily emitted. In FIG. 5, "0°" means a directional angle of 0°. In FIG. 5, "60°" means a directional angle +60° or a directional angle of −60°. The transmittance herein can be measured in the similar manner as the transmittance described later. FIG. 5 shows the case where the translucent thin film formed of magnesium fluoride having a physical film thickness of 300 nm is provided on the light emission side of the wavelength converting member. The ceramic composite used may be, for example, the ceramic composite A described later. FIG. 5 shows an example of the wavelength converting member including the translucent thin film having a physical film thickness in a range of 250 nm or more and 330 nm or less. The physical film thickness of the translucent thin film is not limited to 300 nm shown in FIG. 5, and is not limited to the range of 250 nm or more and 330 nm or less.

As described above, at a directional angle around 0° (i.e., $\theta=0°$ in FIG. 4), there is a tendency that light having a light emission peak wavelength in a range of 380 nm or more and 500 nm or less of the light emitting device is readily emitted in the case where the wavelength converting member does not include the translucent thin film.

In the light emitting device including the wavelength converting member including the translucent thin film, at a directional angle of 0°, emitted light having a light emission peak wavelength in a range of 380 nm or more and 500 nm or less of the light emitting element, which is readily emitted, and emitted light having a light emission peak wavelength in a range of 510 nm or more and 570 nm or less of the inorganic fluorescent material, which is readily transmitted through the translucent thin film, are mixed to enhance only the emitted light of the light emitting device in a region near a directional angle of 0°, and thereby the balance between the emitted light from the light emitting element and the emitted light from the inorganic fluorescent material is favorably retained while preventing a large change in chromaticity from occurring, resulting in good directional chromaticity characteristics.

The case where the angle inclined from a directional angle of 0° (i.e., $\theta=0°$ in FIG. 4) in parallel to the light axis z toward the direction horizontal to the light emitting plane of the light emitting device, i.e., the directional angle, is changed will be described.

In the direction of an angle inclined from a directional angle of 0° (i.e., $\theta=0°$ in FIG. 4) in parallel to the light axis z toward the direction horizontal to the light emitting plane of the light emitting device, for example, in the directions of a directional angle of +60° and a directional angle of −60° (i.e., θ=+60° on the x axis or the y axis and θ=−60° on the x axis or the y axis in FIG. 4), the transmittance of the emitted light of the inorganic fluorescent material (for example, emitted light having a light emission peak wavelength around 550 nm) is lower than the emitted light of the light emitting element (for example, emitted light having a light emission peak wavelength around 450 nm). Accordingly, as compared to the case where the wavelength converting member does not include the translucent thin film, in the case where the wavelength converting member includes the translucent thin film, the transmission of the emitted light of the inorganic fluorescent material included in the wavelength converting member through the translucent thin film becomes more difficult in the direction of a directional angle of +60° and the direction of a directional angle of −60°. Furthermore, there is a tendency that the emitted light of the inorganic fluorescent material in the case where the wavelength converting member includes the translucent thin film is difficult to emit in the direction of a directional angle of +60° and the direction of a directional angle of −60°, as compared to the emitted light of the inorganic fluorescent material in the case where the wavelength converting member does not include the translucent thin film.

As shown in FIG. 5, in the case where the directional angle is +60° or −60°, and the translucent thin film satisfying the particular condition is provided in the wavelength converting member, in a region exceeding a wavelength of 470 nm, the transmittance of the wavelength converting member including the translucent thin film becomes lower than the case where the directional angle is 0°, and the emitted light of the inorganic fluorescent material is difficult to emit.

As described above, in the case where the angle inclined from a directional angle of 0° toward the horizontal direction is increased, for example, in the case where the directional angle is changed from 0° toward +90° or −90° (i.e., from θ=0° to θ=+90° on the x axis or the y axis or θ=−90° on the x axis or the y axis in FIG. 4), there is a tendency that the emitted light of the inorganic fluorescent material having a light emission peak wavelength in a range of 510 nm or more and 570 nm or less is readily emitted in the case where the wavelength converting member does not include the translucent thin film.

In the light emitting device including the wavelength converting member including the translucent thin film, in the case where the directional angle is changed from 0° toward +900 or −90°, for example, in the case where the directional angle is changed from 0° to +60° or −60°, light having a light emission peak wavelength in a range of 380 nm or more and 500 nm or less of the light emitting element and light having a light emission peak wavelength in a range of 510 nm or more and 570 nm or less of the inorganic fluorescent material, which is difficult to transmit through the translucent thin film, are mixed to enhance only the emitted light from the inorganic fluorescent material even in the case where the directional angle is changed from 0° to +60° or −60°, and thereby the balance between the emitted light from the light emitting element and the emitted light from the inorganic fluorescent material is favorably retained while preventing a large change in chromaticity from occurring, resulting in good directional chromaticity characteristics.

It is considered that according to this mechanism, the extents of color mixing of the emitted light of the inorganic fluorescent material and the emitted light of the light emitting device in the direction of a directional angle of 0° and the direction of a directional angle of +60° or −60° become equivalent to each other under certain conditions, and thereby the change in chromaticity is small even though the directional angle is changed.

The light emitting device of the fourth embodiment includes the wavelength converting member including the translucent thin film that is a single layer comprising or formed of a fluoride or silicon dioxide, and the translucent thin film has an L value calculated by the expression (2), which is the ratio of the physical film thickness $L_1$ of the translucent thin film with respect to the optical film thickness $L_0$ of the translucent thin film calculated by the expression (1), in a range of 2.5 or more and 3.5 or less. The light emitting device of the fourth embodiment may include a translucent thin film that is a single layer formed of a fluoride or silicon dioxide having a physical film thickness $L_1$ in a range of 250 nm or more and 330 nm or less. In the case where the translucent thin film having an L value calculated by the expression (2) in a range of 2.5 or more and 3.5 or less is provided in the light emitting device, the change in chromaticity is small even though the directional angle is changed, and the directional chromaticity characteristics can be improved. The translucent thin film provided in the light emitting device preferably has an L value in a range of 2.5 or more and 3.5 or less, more preferably in a range of 2.5 or more and 3.4 or less, and further preferably in a range of 2.5 or more and 3.2 or less, for improving the directional chromaticity characteristics.

Figure 6:
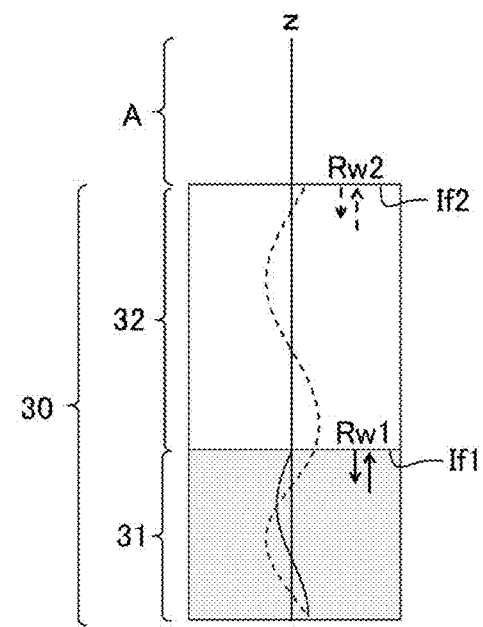
FIG. 6 is a conceptual diagram showing a schematic enlarged view of a part of the exemplary wavelength converting member.

FIG. 6 is a conceptual diagram showing a schematic enlarged view of a part of the wavelength converting member of the light emitting device. The scales of enlargement in FIG. 3 and FIG. 6 may not be the same as each other. In the case where the L value calculated by the expression (2) for 550 nm comes close to 3.0, the phase of the second reflected wave Rw2 generated from light having a light emission peak wavelength in a range of 380 nm or more and 500 nm or less at the interface If2 between the translucent thin film 32 and the air A and the phase of the first reflected wave Rw1 generated therefrom at the interface If1 between the ceramic composite 31 and the translucent thin film 32 are deviated from each other to increase the light reflected in the wavelength converting member 30 as compared to the case where the L value of the translucent thin film 32 comes close to 1.0, and thereby the transmitted light is reduced as compared to the case where the translucent thin film 32 is not provided. In the case where the light emitting device includes the translucent thin film having an L value calculated by the expression (2) in a range of 2.5 or more and 3.5 or less, a part of light emitted from the light emitting device is reduced through reflection, and thereby the emission of light having a light emission peak wavelength in a range of 380 nm or more and 500 nm or less, which is readily emitted from the light emitting device, is reduced at a directional angle of 0°. In the case where the translucent thin film having an L value calculated by the expression (2) in a range of 2.5 or more and 3.5 or less is provided, and the directional angle of light emitted from the light emitting device comes close to a directional angle of +90° or a directional angle of −90°, the emission of light having a light emission peak wavelength in a range of 510 nm or more and 570 nm or less, which is readily emitted from the light emitting device, is reduced. In the case where the light emitting device includes the translucent thin film having an L value in a range of 2.5 or more and 3.5 or less, the emission of light having a light emission peak wavelength in a range of 380 nm or more and 500 nm or less, which is readily emitted at a directional angle of 0°, is reduced, and the emission of light having a light emission peak wavelength in a range of 510 nm or more and 570 nm or less, which is readily emitted at a directional angle that comes close to +900 or −90°, is reduced, thereby reducing the color unevenness caused by the change in directional angle, resulting in improvement of the directional chromaticity characteristics.

The light emitting device of the fifth embodiment includes the wavelength converting member including the translucent thin film comprising or formed of a fluoride or silicon dioxide, and the light emitting device preferably emits light satisfying a first transmittance difference T1 calculated based on the following expression (3) in a range of 0% or more and 25% or less, which is obtained by subtracting the difference between the transmittance of transmitted light from the light emitting plane of the wavelength converting member at the light emission peak wavelength of the inorganic fluorescent material and the transmittance thereof at the light emission peak wavelength of the light emitting element at a directional angle of 0°, from the difference between the transmittance of transmitted light from the light emitting plane of the wavelength converting member at the light emission peak wavelength of the inorganic fluorescent material and the transmittance thereof at the light emission peak wavelength of the light emitting element at a directional angle of +60° or −60°. The light emitting device may emit light satisfying a second transmittance difference T2 calculated based on the expression (4) described later in a range of −3% or more and 10% or less. The translucent thin film comprising or formed of a fluoride or silicon dioxide is preferably a single layer.

$$T1 = T_{C-60} - T_{P-60} - (T_{C-0} - T_{P-0}) \quad (3)$$

In the expression (3), $T_{C-60}$ represents an average value of transmittances of transmitted light from the light emitting plane of the wavelength converting member at a light emission peak wavelength of the light emitting element at a directional angle of +60° and a directional angle of −60°; $T_{P-60}$ represents an average value of transmittances of transmitted light from the light emitting plane of the wavelength converting member at a light emission peak wavelength of the inorganic fluorescent material at a directional angle of +60° and a directional angle of −60°; $T_{C-0}$ represents a transmittance of transmitted light from the light emitting plane of the wavelength converting member at a light emission peak wavelength of the light emitting element at a directional angle of 0°, and $T_{P-0}$ represents a transmittance of transmitted light from the light emitting plane of the wavelength converting member at a light emission peak wavelength of the inorganic fluorescent material at a directional angle of 0°, wherein a directional angle of 0° is an angle perpendicular to the light emitting plane, directional angles of +600 and −60° are angles inclined from the angle perpendicular to the light emitting plane toward the light emitting plane by +600 and −60°, respectively, with a directional angle of 0° as center.

The transmittance of transmitted light of the wavelength converting member is a ratio of an intensity $I_1$ of light transmitted through the wavelength converting member with respect to an intensity $I_0$ of light incident on the wavelength converting member, and can be calculated by the following expression (10).

$$\text{Transmittance (\%)} = I_1 / I_0 \times 100 \quad (10)$$

In the expression, $I_0$ represents the intensity of light incident on the wavelength converting member, and $I_1$ represents the intensity of light transmitted through the wavelength converting member.

The intensity of the transmitted light from the light emitting plane of the wavelength converting member varies depending on the wavelength of the transmitted light and the directional angle. In the case where the light emitting device can emit light satisfying the first transmittance difference T1 in a range of 0% or more and 25% or less, which is obtained by subtracting the difference between the transmittance of transmitted light from the light emitting plane of the wavelength converting member at the light emission peak wavelength of the inorganic fluorescent material and the transmittance thereof at the light emission peak wavelength of the light emitting element at a directional angle of 0°, from the difference between the transmittance of transmitted light from the light emitting plane of the wavelength converting member at the light emission peak wavelength of the inorganic fluorescent material and the transmittance thereof at the light emission peak wavelength of the light emitting element at a directional angle of +600 or −60°, the change in directional chromaticity due to the change in directional angle can be reduced even though the directional angle is changed, and thereby the directional chromaticity characteristics of the emitted light of the light emitting device can be improved.

As for the emitted light of the light emitting device, as described above, there is a tendency that the transmittance of light having the light emission peak wavelength of the light emitting element is increased at a directional angle of 0°, and there is a tendency that the transmittance of light having the light emission peak wavelength of the inorganic fluorescent material is increased at a directional angle coming close to a directional angle of +90° or −90°.

In the case where the light emitting device can emit light satisfying that the value of the first transmittance difference T1 is in a range of 0% or more and 25% or less, the transmittance of light having the light emission peak wavelength of the inorganic fluorescent material is increased at an angle near a directional angle of 0°, and the balance thereof with the transmittance of light having the light emission peak wavelength of the light emitting element, which tends to increase at an angle near a directional angle of 0°, can be favorably retained, resulting in good directional chromaticity characteristics of the light emitting device.

The first transmittance difference T1 of the emitted light of the light emitting device may satisfy a range of 3% or more and 22% or less, may satisfy a range of 5% or more and 20% or less, preferably satisfies a range of 8% or more and 15% or less, more preferably satisfies a range of 10% or more and 14% or less, further preferably satisfies a range of 11% or more and 14% or less, and particularly preferably satisfies a range of 12.5% or more and 13.5% or less. In the case where light emitted from the light emitting device satisfies that the first transmittance difference T1 is in a range of 8% or more and 15% or less, the difference $\Delta x$ of the directional chromaticity is small, and the graph showing the relationship between the directional angle and the difference $\Delta x$ of the directional chromaticity becomes a curved line near a horizontal straight line even though the directional angle is increased, resulting in improvement of the directional chromaticity characteristics.

In the case where the value of the first transmittance difference T1 of the emitted light the light emitting device is less than 0% or exceeds 25%, the transmittance of light having the light emission peak wavelength of the light emitting element is increased at an angle near a directional angle of 0°, and the transmittance of light having the light emission peak wavelength of the light emitting element, which tends to increase at an angle near a directional angle of 0°, is further increased. The emitted light of the light emitting device that has the first transmittance difference T1 of less than 0% or exceeding 25% undergoes a large change in chromaticity, resulting in inferior directional chromaticity characteristics. In the emitted light of the light emitting device that has the first transmittance difference T1 of less than 0% or exceeding 25%, the transmittance of the transmitted light having the light emission peak wavelength of the inorganic fluorescent material is increased at an angle near a directional angle of +600 or −60°, and the transmittance of light having the light emission peak wavelength of the inorganic fluorescent material, which tends to increase at an angle of a large directional angle, is further increased to cause change in chromaticity, resulting in inferior directional chromaticity characteristics.

The light emitting device of the fifth embodiment includes the wavelength converting member including the translucent thin film comprising or formed of a fluoride or silicon dioxide, and the light emitting device preferably emit light satisfying the second transmittance difference T2 calculated based on the following expression (4) in a range of −3% or more and 10% or less, which is obtained by subtracting the difference between the transmittance of transmitted light from the light emitting plane of the wavelength converting member at the light emission peak wavelength of the inorganic fluorescent material and the transmittance thereof at the light emission peak wavelength of the light emitting element at a directional angle of 0°, from the difference between the transmittance of transmitted light from the light emitting plane of the wavelength converting member at the light emission peak wavelength of the inorganic fluorescent material and the transmittance thereof at the light emission peak wavelength of the light emitting element at a directional angle of +300 or −30°. The light emitting device may emit light satisfying the first transmittance difference T1 calculated based on the expression (3) in a range of 0% or more and 25% or less. The translucent thin film comprising or formed of a fluoride or silicon dioxide is preferably a single layer.

$$T2 = T_{C\text{-}30} - T_{P\text{-}30} - (T_{C\text{-}0} - T_{P\text{-}0}) \quad (4)$$

In the expression (4), $T_{C\text{-}30}$ represents an average value of transmittances of transmitted light from the light emitting plane of the wavelength converting member at a light emission peak wavelength of the light emitting element at a directional angle of +30° and a directional angle of −30°; $T_{P\text{-}30}$ represents an average value of transmittances of transmitted light from the light emitting plane of the wavelength converting member at a light emission peak wavelength of the inorganic fluorescent material at a directional angle of +30° and a directional angle of −30°; and $T_{C\text{-}0}$ and $T_{P\text{-}0}$ have the same meanings as in the expression (3), wherein directional angles of +30° and −30° are angles inclined from the angle perpendicular to the light emitting plane toward the light emitting plane by +300 and −30°, respectively, with a directional angle of 0° as center.

In the case where the emitted light of the light emitting device satisfies the second transmittance difference T2 in a range of −3% or more and 10% or less, the change in chromaticity due to the change in directional angle can be reduced even though the directional angle is changed, and thereby the directional chromaticity characteristics can be improved. The second transmittance difference T2 of the emitted light of the light emitting device may satisfy a range of −2% or more and 8% or less, and may satisfy a range of −1.5% or more and 5% or less. The second transmittance difference T2 of the emitted light of the light emitting device preferably satisfies a range of −1.2% or more and 4.5% or less.

In the case where the emitted light of the light emitting device satisfies a second transmittance difference T2 in a range of −3% or more and 10% or less, the transmittance of light having the light emission peak wavelength of the inorganic fluorescent material is increased at an angle near a directional angle of 0°, and the balance thereof with the transmittance of light having the light emission peak wavelength of the light emitting element, which tends to increase at an angle near a directional angle of 0°, can be favorably retained, resulting in good directional chromaticity characteristics of the light emitting device. In the case where the emitted light of the light emitting device satisfies the second transmittance difference T2 in a range of −3% or more and 10% or less, the transmittance of light having the light emission peak wavelength of the light emitting element is increased at an angle near a directional angle of +300 or −30°, and the balance thereof with the transmittance of light having the light emission peak wavelength of the inorganic fluorescent material, which tends to increase when the directional angle is increased, can be favorably retained, resulting in good directional chromaticity characteristics of the light emitting device.

In the case where the translucent thin film is a single layer, the refractive index r2 of the translucent thin film is preferably in a range of 1.32 or more and 1.48 or less, and may be in a range of 1.33 or more and 1.47 or less. In the case where the refractive index r2 of the translucent thin film is in a range of 1.32 or more and 1.48 or less, the first reflected wave generated at the interface between the ceramic composite and the translucent thin film can be cancelled out by the second reflected wave having the opposite phase generated at the interface between the translucent thin film and the air, so as to reduce the reflection in the wavelength converting member, and light having a high light flux can be emitted by the light emitting device.

In the case where the translucent thin film is a single layer, the refractive index ratio (r1/r2) of the refractive index r1 of the ceramic composite and the refractive index r2 of the translucent thin film is preferably in a range of 1.18 or more and 1.41 or less, may be in a range of 1.20 or more and 1.40 or less, may be in a range of 1.25 or more and 1.35 or less, and may be in a range of 1.28 or more and 1.32 or less. In the case where the refractive index ratio (r1/r2) of the refractive index r1 of the ceramic composite and the refractive index r2 of the translucent thin film is in a range of 1.18 or more and 1.41 or less, the reflection at the interface between the ceramic composite and the translucent thin film can be cancelled out by the reflection at the interface between the translucent thin film and the air, so as to reduce the reflection in the wavelength converting member, and light having a high light flux can be emitted by the light emitting device.

The translucent thin film may not be a single layer but may be a multilayer film including at least two layers of a first layer and a second layer. In the case where the translucent thin film is a multilayer film, for example, a commercially available optical multilayer film may be used.

In the case where the translucent thin film is a multilayer film, the translucent thin film may be a multilayer film including at least two layers of a first layer including silicon dioxide or a fluoride containing at least one kind of an element selected from the group consisting of an alkali metal element, an alkaline earth metal element, and a Group 13 metal element; and a second layer including an oxide containing at least one kind selected from the group consisting of aluminum, niobium, tantalum, titanium, and zirconium, provided that in the case where the translucent thin film includes more than two layers, the translucent thin film is a multilayer film including the first layer and the second layer that are laminated alternately. The refractive index of the first layer and the refractive index of the second layer are different from each other. The fluoride used herein may be the same fluoride as in the translucent thin film that is a single layer.

The light emitting device of the sixth embodiment includes the translucent thin film that is a multilayer film including at least a first layer and a second layer, and the light emitting device emits light satisfying a third transmittance difference T3 calculated based on the following expression (5) in a range of 0% or more and 20% or less, which is obtained by subtracting the difference between the transmittance of transmitted light from the light emitting plane of the wavelength converting member at the light emission peak wavelength of the inorganic fluorescent material and the transmittance thereof at the light emission peak wavelength of the light emitting element at a directional angle of 0°, from the difference between the transmittance of transmitted light from the light emitting plane of the wavelength converting member at the light emission peak wavelength of the inorganic fluorescent material and the transmittance thereof at the light emission peak wavelength of the light emitting element at a directional angle of +45° or −45°. The light emitting device may emit light satisfying the first transmittance difference T1 calculated based on the expression (3) in a range of 0% or more and 25% or less.

$$T3 = T_{C\text{-}45} - T_{P\text{-}45} - (T_{C\text{-}0} - T_{P\text{-}0}) \quad (5)$$

In the expression (5), $T_{C\text{-}45}$ represents an average value of transmittances of transmitted light from the light emitting plane of the wavelength converting member at a light emission peak wavelength of the light emitting element at a directional angle of +45° and a directional angle of −45°, $T_{P\text{-}45}$ represents an average value of transmittances of transmitted light from the light emitting plane of the wavelength converting member at a light emission peak wavelength of the inorganic fluorescent material at a directional angle of +45° and a directional angle of −45°, and $T_{C\text{-}0}$, $T_{P\text{-}0}$ and a directional angle of 0° have the same meanings as in the expression (3), wherein directional angles of +450 and −45° are angles inclined from the angle perpendicular to the light emitting plane toward the light emitting plane by +450 and −45°, respectively, with a directional angle of 0° as center.

In the case where the translucent thin film is a multilayer film including at least a first layer and a second layer, and the light emitting device emits light satisfying the third transmittance difference T3 in a range of 0% or more and 20% or less, the transmittance of light having the light emission peak wavelength of the inorganic fluorescent material is increased at an angle near a directional angle of 0°, and the balance thereof with the transmittance of light having the light emission peak wavelength of the light emitting element, which tends to increase at an angle near a directional angle of 0°, can be favorably retained, resulting in good directional chromaticity characteristics. In the case where the translucent thin film is a multilayer film, and the light emitting device emits light satisfying the third transmittance difference T3 in a range of 0% or more and 20% or less, even though the directional angle is changed, the transmittance of light having the light emission peak wavelength of the light emitting element is increased, and thereby the balance thereof with the transmittance of light having the light emission peak wavelength of the inorganic fluorescent material, which tends to increase when the directional angle is increased, can be favorably retained, resulting in good directional chromaticity characteristics.

In the case where the translucent thin film is a multilayer film including at least a first layer and a second layer, the light emitting device preferably emits light satisfying the first transmittance difference T1 in a range of 0% or more and 25% or less.

Production Method of Translucent Thin Film

In the case where the translucent thin film is a single layer, the translucent thin film can be produced by a chemical vapor deposition method or a physical vapor deposition method. Examples of the physical vapor deposition method include an electron beam vapor deposition method, a resistance heating vapor deposition method, an ion plating method, and a sputtering method. The translucent thin film is preferably formed on the light emitting plane of the ceramic composite by depositing a fluoride or silicon dioxide as a raw material by a resistance heating vapor deposition method in a vacuum atmosphere at a temperature in a range of 25° C. or more and 400° C. or less.

In the case where the translucent thin film is a multilayer film, a raw material for the first layer and a raw material for the second layer may be deposited in this order on the light emitting plane of the ceramic composite by an electron beam (EB) heating vapor deposition method in a vacuum atmosphere at a temperature in a range of 25° C. or more and 400° C. or less.

The members constituting the light emitting device other than the light emitting element and the wavelength converting member will be described below.

Substrate

The substrate is preferably formed of a material that is an insulating material and is difficult to transmit light from the light emitting element and external light. Examples of the material of the substrate include ceramics, such as aluminum oxide and aluminum nitride, and a resin, such as a phenol resin, an epoxy resin, a polyimide resin, a bismaleimide triazine resin (BT resin), and a polyphthalamide (PPA) resin. Ceramics are preferred as the material of the substrate due to the high heat resistance thereof.

Adhesive Layer

The adhesive layer intervenes between the light emitting element and the wavelength converting member, and fixes the light emitting element and the wavelength converting member to each other. An adhesive constituting the adhesive layer is preferably a material capable of optically connecting the light emitting element and the wavelength converting member. The material constituting the adhesive layer is preferably at least one kind of a resin selected from the group consisting of an epoxy resin, a silicone resin, a phenol resin, and a polyimide resin.

Semiconductor Element

Examples of the semiconductor element that is provided depending on necessity in the light emitting device include a transistor for controlling the light emitting element, and a protective element for preventing breakage or deterioration of the light emitting element due to the application of an excessive voltage. Examples of the protective element include a zener diode and a capacitor.

Covering Member

The material used as the covering member is preferably an insulating material. More specifically, examples thereof include a phenol resin, an epoxy resin, a bismaleimide triazine resin (BT resin), a polyphthalamide (PPA) resin, and a silicone resin. The covering member may contain at least one kind of an additive selected from the group consisting of a colorant, a fluorescent material, and a filler, depending on necessity.

Conductive Member

The conductive member used may be bumps, and examples of the material of the bumps include Au or an alloy thereof, and other conductive members, such as eutectic solder (Au—Sn), Pb—Sn, and lead-free solder.

The light emission color of the light emitting device of the seventh embodiment has an absolute value of a difference $\Delta x$ (which may also be referred to as a "difference $\Delta x$ of the directional chromaticity") of 0.012 or less between, in the chromaticity coordinate according to the CIE 1931 chromaticity diagram, an x coordinate $x_0$ of light emission color of the light emitting device at a directional angle of 0° and an x coordinate $x_{60}$, which is the average value of x coordinates of light emission color of the light emitting device at a directional angle of +60° and a directional angle of −60°, respectively. In the case where the difference $\Delta x$ of the directional chromaticity of the light emission color of the light emitting device is 0.012 or less, the change in chromaticity of the light emission color of the light emitting device can be small even though the directional angle is changed, so as to improve the directional chromaticity characteristics. The absolute value of the difference $\Delta x$ between the x coordinate $x_0$ of the light emission color of the light emitting device at a directional angle of 0° and the x coordinate $x_{60}$, which is the average value of x coordinates of light emission color of the light emitting device at a directional angle of +60° and a directional angle of −60°, is more preferably 0.011 or less, further preferably 0.010 or less, and still further preferably 0.009 or less, may be 0, and may be 0.001 or more.

The light emission color of the light emitting device preferably has, in the chromaticity coordinate according to the CIE 1931 chromaticity diagram, an absolute value of a difference $\Delta y$ (which may also be referred to as a "difference $\Delta y$ of the directional chromaticity") between a y coordinate $y_0$ of emission color of the light emitting device at a directional angle of 0° and a y coordinate $y_{60}$, which is the average value of y coordinates of emission color of the light emitting device at a directional angle of +600 and a directional angle of −60°, respectively, which is preferably 0.032 or less, may be 0.031 or less, may be 0.030 or less, may be 0.029 or less, may be 0, and may be 0.001 or more. In the case where the difference $\Delta y$ of the directional chromaticity of the light emission color of the light emitting device is 0.032 or less, the change in chromaticity of the light emission color of the light emitting device can be small even though the directional angle is changed, so as to improve the directional chromaticity characteristics.

Production Method of Light Emitting Device

One example of the production method of the light emitting device will be described. For the details thereof, reference may be made to the description of Japanese Unexamined Patent Publication No. 2014-112635 and Japanese Unexamined Patent Publication No. 2017-117912. The production method of the light emitting device preferably includes a disposing step of the light emitting element, a disposing step of the semiconductor element depending on necessity, a forming step of the wavelength converting member including the ceramic composite, an adhering step of the light emitting element and the wavelength converting member, and a forming step of the covering member.

Disposing Step of Light Emitting Element

In the disposing step of the light emitting element, the light emitting element is disposed on the substrate and mounted thereon. The light emitting element and the semiconductor element may be, for example, flip chip mounted on the substrate.

Adhering Step of Light Emitting Element and Wavelength Converting Member

In the adhering step of the light emitting element and the wavelength converting member, the wavelength converting member is allowed to face the light emitting plane of the light emitting element, and the wavelength converting member is adhered on the light emitting element through an adhesive layer.

Forming Step of Covering Member

In the forming step of the covering member, the side surfaces of the light emitting element and the wavelength converting member except for the light emitting plane are covered with a composition for the covering member, and the covering member is formed on the side surfaces of the light emitting element and the wavelength converting member except for the light emitting plane. The covering member is for reflecting light emitted from the light emitting element, and is formed to cover the side surface of the wavelength converting member without covering the light emitting plane thereof, and to embed the semiconductor element therein.

The light emitting device shown in FIGS. 1 and 2 can be produced in the aforementioned manner.

EXAMPLES

The present disclosure will be specifically described with reference to examples. The present invention is not limited to the examples.

Production of Ceramic Composite A

A rare earth aluminate fluorescent material having a composition represented by $(Y_{0.866}Gd_{0.13}Ce_{0.04})_3Al_5O_{12}$ was prepared as the inorganic fluorescent material.

Aluminum oxide ($Al_2O_3$) particles having an aluminum oxide purity of 99% by mass were prepared as the inorganic oxide.

30% by mass of the rare earth aluminate fluorescent material and 70% by mass of the aluminum oxide particles were mixed to provide a raw material mixture.

The raw material mixture was charged in a mold and molded under a pressure of 5 MPa (51 kgf/cm$^2$) to form a molded article in a cylindrical shape having a diameter of 65 mm and a thickness of 15 mm. The resulting molded article was placed in a packaging container and vacuum packaged therein, and then subjected to CIP at 176 MPa with a cold isostatic press machine (manufactured by Kobe Steel, Ltd. (KOBELCO)), so as to provide a molded article.

The resulting molded article was primarily baked at a temperature of 1,650° C. in the air atmosphere (0.101 MPa, oxygen concentration: 20% by volume) with a baking furnace (manufactured by Marusho Denki Co., Ltd.), so as to provide a first sintered article.

The resulting first sintered article was secondarily baked by HIP using nitrogen gas as a pressure medium in a nitrogen gas atmosphere (99.99% by volume or more) at a temperature of 1,650° C. and a pressure of 195 MPa for 2 hours with a hot isostatic press (HIP) machine (manufactured by Kobe Steel, Ltd. (KOBELCO)), so as to provide a second sintered article. The second sintered article was cut with a wire saw into the prescribed shape and size, and the cut surface was ground with a plane grinder, so as to provide a ceramic composite A in a plate form having a thickness of 180 μm. The ceramic composite A had a refractive index r1 of 1.78. The refractive index r1 of the ceramic composite A can be obtained from the refractive index of the rare earth aluminate fluorescent material of 1.82, the content thereof of 30% by mass, and the true density thereof of 4.77 g/cm$^3$, the refractive index of aluminum oxide of 1.77, the content thereof of 70% by mass, and the true density thereof of 3.98 g/cm$^3$ in the ceramic composite, according to the expression (6).

Production of Ceramic Composite B

A rare earth aluminate fluorescent material having a composition represented by $(Y_{0.828}Gd_{0.17}Ce_{0.002})_3Al_5O_{12}$ was prepared as the inorganic fluorescent material.

A ceramic composite B in a plate form having a thickness of 180 μm was obtained in the same manner as in the production of the ceramic composite A except that yttrium aluminum perovskite (YAlO$_3$: YAP) particles were prepared as the inorganic oxide, and a raw material mixture obtained by mixing 95% by mass of the rare earth aluminate fluorescent material and 5% by mass of the YAP particles was used. The ceramic composite B had a refractive index r1 of 1.83. The refractive index r1 of the ceramic composite B can be obtained from the refractive index of the rare earth aluminate fluorescent material of 1.82, the content thereof of 95% by mass, and the true density thereof of 4.82 g/cm$^3$, the refractive index of YAP of 1.93, the content thereof of 5% by mass, and the true density thereof of 5.55 g/cm$^3$ in the ceramic composite, according to the expression (6).

Production of Ceramic Composite C

A rare earth aluminate fluorescent material having a composition represented by $(Y_{0.92}Gd_{0.07}Ce_{0.01})_3Al_5O_{12}$ was prepared as the inorganic fluorescent material.

A ceramic composite C in a plate form having a thickness of 180 μm was obtained in the same manner as in the production of the ceramic composite A except that a raw material mixture obtained by mixing 11.5% by mass of the rare earth aluminate fluorescent material and 88.5% by mass of the aluminum oxide particles used in the ceramic composite A was used. The ceramic composite C had a refractive index r1 of 1.77. The refractive index r1 of the ceramic composite C can be obtained from the refractive index of the rare earth aluminate fluorescent material of 1.82, the content thereof of 11.5% by mass, and the true density thereof of 4.69 g/cm$^3$, the refractive index of aluminum oxide of 1.76, the content thereof of 88.5% by mass, and the true density thereof of 3.98 g/cm$^3$ in the ceramic composite, according to the expression (6).

Light Emitting Devices of Examples A-1 to A-3

Production of Wavelength Converting Member

The ceramic composite A and magnesium fluoride as a vapor deposition material were placed in a vapor deposition apparatus, and in the state where the pressure inside the vapor deposition apparatus was reduced to $1.0 \times 10^{-4}$ Pa, a translucent thin film (MgF$_2$ film) having a physical film thickness of 102 nm, 111 nm, or 120 nm was formed by the resistance heating vapor deposition method with a micro heater on the light emitting plane of the ceramic composite A to be the emission side of light at a temperature of the ceramic composite A in the film formation of 300° C., so as to provide wavelength converting members A-1 to A-3 having the physical film thicknesses. The physical film thickness of the translucent thin film was measured by the method described later. The refractive index r2 of the translucent thin film was 1.38, which was the refractive index of MgF$_2$. The refractive index ratio (r1/r2) of the refractive index r1 of the ceramic composite A and the refractive index r2 of the translucent thin film was 1.33.

Production of Light Emitting Device

The light emitting device 100 shown in FIGS. 1 and 2 was produced in the following manner using each of the resulting wavelength converting members A-1 to A-3. The light emitting element 20 and the semiconductor element 70 were placed on the mounting substrate 10. Specifically, the light emitting element 20 including a nitride semiconductor accumulated on a sapphire substrate, having a thickness of approximately 0.11 mm and a square planar shape having an edge of approximately 1.0 mm, having a light emission peak wavelength of 450 nm was disposed in such a manner that the side of the sapphire substrate as the semiconductor growth substrate was allowed to be a light emitting plane, and the light emitting element 20 and the semiconductor element 70 were aligned in a line, and flip chip mounted on a conductor pattern formed on the mounting substrate 10 with the conductor member 60 formed of Au.

Subsequently, a silicone resin as the adhesive 40 was disposed on the upper surface of the light emitting element 20, and the wavelength converting member 30 obtained by forming each of the ceramic composites of Examples and Comparative Examples into a plate form and the upper surface of the sapphire substrate of the light emitting element 20 were adhered to each other.

Subsequently, the covering member 50 was disposed along the side surfaces of the light emitting element 20 and the wavelength converting member 30, and simultaneously, the semiconductor element 70 was completely embedded in the covering member 50. The resin 51 contained in the covering member 50 was a dimethylsilicone resin, and titanium oxide particles having an average particle diameter of 0.28 μm were contained as the light reflecting material 52 therein in an amount of 60% by mass based on the resin 51. The light emitting device 100 shown in FIGS. 1 and 2 was thus produced through the aforementioned process. The resulting light emitting device was a light emitting device according to the first embodiment or the second embodiment.

Light Emitting Device of Comparative Example a'-1

A light emitting device of Comparative Example a'-1 was produced in the same manner as in Example A-1 except that the ceramic composite A having no translucent thin film formed thereon (physical film thickness of MgF$_2$ film: 0 nm) was used.

Light Emitting Device of Comparative Example a'-2

A translucent thin film (MgF$_2$ film) having a physical thickness of 200 nm was formed on the ceramic composite A in the same manner as in Example A-1 to provide a wavelength converting member a'-2. A light emitting device of Comparative Example a'-2 was produced in the same manner as in Example A-1 except that the wavelength converting member a'-2 having a physical film thickness of the translucent thin film (MgF$_2$ film) of 200 nm was used.

Light Emitting Devices of Examples B-1 to B-5

The ceramic composite B and magnesium fluoride as a vapor deposition material were placed in a vapor deposition apparatus, and in the state where the pressure inside the vapor deposition apparatus was reduced to $1.0 \times 10^{-4}$ Pa, a translucent thin film (MgF$_2$ film) having a physical film thickness of 85 nm, 88 nm, 103 nm, 113 nm, or 122 nm was formed by the resistance heating vapor deposition method with a micro heater on the light emitting plane of the ceramic composite B to be the emission side of light at a temperature of the ceramic composite B in the film formation of 300° C., so as to provide wavelength converting members B-1 to B-5 having the physical film thicknesses. The physical film thickness of the translucent thin film was measured by the method described later. Light emitting devices of Examples B-1 to B-5 were produced in the same manner as in Examples A-1 except that these wavelength converting members were used. The refractive index r2 of the translucent thin film was 1.38, which was the refractive index of $MgF_2$. The refractive index ratio (r1/r2) of the refractive index r1 of the ceramic composite B and the refractive index r2 of the translucent thin film was 1.33.

Light Emitting Device of Comparative Example b'-1

A light emitting device of Comparative Example b'-1 was produced in the same manner as in Example B-1 except that the ceramic composite B having no translucent thin film formed thereon (physical film thickness of $MgF_2$ film: 0 nm) was used.

Light Emitting Device of Comparative Example b'-2

A translucent thin film ($MgF_2$ film) having a physical film thickness of 205 nm was formed on the ceramic composite B in the same manner as in Example B-1 to provide a wavelength converting member b'-2. A light emitting device of Comparative Example b'-2 was produced in the same manner as in Example B-1 except that the wavelength converting member b'-2 having a physical film thickness of the translucent thin film ($MgF_2$ film) of 205 nm was used.

Light Emitting Devices of Examples C-1 to C-5

The ceramic composite C and magnesium fluoride were placed in a vapor deposition apparatus, and in the state where the pressure inside the vapor deposition apparatus was reduced to $1.0 \times 10^{-4}$ Pa, a translucent thin film ($MgF_2$ film) having a physical film thickness of 83 nm, 90 nm, 100 nm, 115 nm, or 123 nm was formed by the resistance heating vapor deposition method with a micro heater on the light emitting plane of the ceramic composite C to be the emission side of light at a temperature of the ceramic composite C in the film formation of 300° C., so as to provide wavelength converting members C-1 to C-5 having the physical film thicknesses. The physical film thickness of the translucent thin film was measured by the method described later. Light emitting devices of Examples C-1 to C-5 were produced in the same manner as in Examples A-1 except that these wavelength converting members were used. The refractive index r2 of the translucent thin film was 1.38, which was the refractive index of $MgF_2$. The refractive index ratio (r1/r2) of the refractive index r1 of the ceramic composite C and the refractive index r2 of the translucent thin film was 1.28.

Light Emitting Device of Comparative Example c'-1

A light emitting device of Comparative Example c'-1 was produced in the same manner as in Example C-1 except that the ceramic composite C having no translucent thin film formed thereon (physical film thickness of $MgF_2$ film: 0 nm) was used.

Light Emitting Device of Comparative Example c'-2

A translucent thin film ($MgF_2$ film) having a physical film thickness of 148 nm was formed on the ceramic composite C in the same manner as in Example C-1 to provide a wavelength converting member c'-2. A light emitting device of Comparative Example c'-2 was produced in the same manner as in Example C-1 except that the wavelength converting member c'-2 having a physical film thickness of the translucent thin film ($MgF_2$ film) of 148 nm was used.

The translucent thin films of the wavelength converting members used in Examples and Comparative Examples and the light emitting devices of Examples and Comparative Examples were evaluated in the following manner. The light emitting devices each were measured with a constant current of 350 mA applied thereto. The results are shown in Tables 1 to 3.

Physical Film Thickness of Translucent Thin Film of Wavelength Converting Member The physical film thickness $L_1$ of the translucent thin film was measured in the cross sectional SEM image of each of the wavelength converting members. The cross sectional SEM image of the wavelength converting member was measured at three positions, and the arithmetic average thereof was designated as the physical film thickness of the translucent thin film.

L Value

The optical film thickness $L_0$ (nm) of the translucent thin film was calculated by the following expression (1). The light emission peak wavelength of the rare earth aluminate fluorescent material used in the ceramic composites A to C was 550 nm, and in the case where the translucent thin film was the $MgF_2$ film formed of $MgF_2$, the refractive index of the translucent thin film was 1.38, which was the refractive index of $MgF_2$. In the case where the translucent thin film was the $SiO_2$ film formed of $SiO_2$, the refractive index of the translucent thin film was 1.47, which was the refractive index of $SiO_2$. The L value of each of the translucent thin films used in Examples and Comparative Examples was calculated from the physical film thickness $L_1$ and the optical film thickness $L_0$ thereof based on the following expression (2).

$L_0$=light emission peak wavelength ($\lambda$) (nm) of inorganic fluorescent material/(4×refractive index of translucent thin film)     (1)

$L$=physical film thickness $L_1$ (nm) of translucent thin film/$L_0$     (2)

Chromaticity Coordinate (x,y)

For each of the light emitting devices of Examples and Comparative Examples, the chromaticity coordinate (x,y) in the CIE 1931 chromaticity diagram was obtained with an optical measurement equipment including a multichannel spectroscope and an integrating sphere. The chromaticity coordinate (x,y) of the light emission color of each of the light emitting devices means the chromaticity coordinate $(x_0, y_0)$ at a directional angle of 0°.

Relative Light Flux

For each of the light emitting devices of Examples and Comparative Examples, the total light flux was measured with a spectral photometric analyzer using an integrating sphere (PMA-11, manufactured by Hamamatsu Photonics K.K.). For each of the light emitting devices of Examples A-1 to A-3 and Comparative Examples a'-1 and a'-2, the total light flux of the light emitting device was expressed in terms of relative value (relative light flux (%)) based on the total flux of light emitted from the light emitting device of Comparative Example a'-1 having a physical film thickness of the translucent thin film of 0 nm as 100%. For each of the light emitting devices of Examples B-1 to B-5 and Comparative Examples b'-1 and b'-2, the total light flux of the light emitting device was expressed in terms of relative value (relative light flux (%)) based on the total flux of light emitted from the light emitting device of Comparative Example b'-1 having a physical film thickness of the translucent thin film of 0 nm as 100%. For each of the light emitting devices of Examples C-1 to C-5 and Comparative Examples c'-1 and c'-2, the total light flux of the light emitting device was expressed in terms of relative value (relative light flux (%)) based on the total flux of light emitted from the light emitting device of Comparative Example c'-1 having a physical film thickness of the translucent thin film of 0 nm as 100%.

Directional Chromaticity Coordinate $(x_\theta, y_\theta)$

The light emitting device was disposed on a rotating platform, which was remote from a diffusion plate connected to a multichannel spectral photometric analyzer (PMA-11, manufactured by Hamamatsu Photonics K.K.) in the light axis direction (perpendicular direction) by 100 mm, in such a manner that the light emitting plane thereof was directed to the diffusion plate having a circular aperture having a light receiving area of 100 mm$^2$, and under application of a constant current of 350 mA to the light emitting device, the chromaticity coordinate $(x_0, y_0)$ of the light emission color at a directional angle of 0° in parallel to the light axis was measured. Subsequently, the rotating platform was rotated left and right by 60° from the light axis, and the x coordinate $x_{60}$, which was the average value of x coordinates at a directional angle of +60° and a directional angle of −60°, and the y coordinate $y_{60}$, which was the average value of y coordinates at a directional angle of +60° and a directional angle of −60°, were measured as the directional chromaticity coordinate $(x_{60}, y_{60})$. The directional chromaticity coordinate $(x_{60}, y_{60})$ means the average value of the two values at a directional angle of +600 and a directional angle of −60° obtained by moving the rotating platform left and right. In the chromaticity coordinate in the CIE 1931 chromaticity diagram, the absolute value of the difference Δx (difference Δx of the directional chromaticity) between the x coordinate $x_0$ of the light emission color of the light emitting device at a directional angle of 0° and the x coordinate $x_{60}$, which was the average value of the light emission color of the light emitting device at a directional angle of +60° and a directional angle of −60°, was measured. The directional chromaticity coordinate $(x_\theta, y_\theta)$ means the average value of the values at a directional angle of +0 degree and a directional angle of −0 degree.

TABLE 1

| | Translucent thin film | | Light emitting device | | | |
|---|---|---|---|---|---|---|
| | Physical film thickness | | Chromaticity coordinate | | Relative light | Difference of directional chromaticity |
| | (nm) | L value | x | y | flux (%) | Δx |
| Comparative Example a'-1 | 0 | 0 | 0.319 | 0.333 | 100.0 | 0.012 |
| Example A-1 | 102 | 1.02 | 0.315 | 0.326 | 101.0 | 0.009 |
| Example A-2 | 111 | 1.11 | 0.317 | 0.330 | 100.9 | 0.010 |
| Example A-3 | 120 | 1.20 | 0.318 | 0.332 | 100.4 | 0.010 |
| Comparative Example a'-2 | 200 | 2.01 | 0.319 | 0.333 | 99.1 | 0.018 |

TABLE 2

| | Translucent thin film | | Light emitting device | | | |
|---|---|---|---|---|---|---|
| | Physical film thickness | | Chromaticity coordinate | | Relative light | Difference of directional chromaticity |
| | (nm) | L value | x | y | flux (%) | Δx |
| Comparative Example b'-1 | 0 | 0 | 0.318 | 0.328 | 100.0 | 0.017 |
| Example B-1 | 85 | 0.85 | 0.313 | 0.319 | 100.8 | 0.016 |
| Example B-2 | 88 | 0.88 | 0.312 | 0.317 | 101.1 | 0.015 |
| Example B-3 | 103 | 1.03 | 0.311 | 0.316 | 101.2 | 0.015 |
| Example B-4 | 113 | 1.13 | 0.312 | 0.318 | 101.4 | 0.015 |
| Example B-5 | 122 | 1.22 | 0.313 | 0.319 | 100.9 | 0.015 |
| Comparative Example b'-2 | 205 | 2.06 | 0.317 | 0.326 | 99.2 | 0.024 |

TABLE 3

| | Translucent thin film | | Light emitting device | | |
|---|---|---|---|---|---|
| | Physical film thickness | | Chromaticity coordinate | Relative light flux | Difference of directional chromaticity |
| | (nm) | L value | x | y | (%) | Δx |
| Comparative Example c'-1 | 0 | 0 | 0.322 | 0.335 | 100.0 | 0.014 |
| Example C-1 | 83 | 0.83 | 0.318 | 0.327 | 102.3 | 0.014 |
| Example C-2 | 90 | 0.90 | 0.318 | 0.328 | 102.6 | 0.014 |
| Example C-3 | 100 | 1.00 | 0.318 | 0.328 | 102.8 | 0.015 |
| Example C-4 | 115 | 1.15 | 0.317 | 0.325 | 101.5 | 0.014 |
| Example C-5 | 123 | 1.23 | 0.318 | 0.328 | 101.7 | 0.013 |
| Comparative Example c'-2 | 148 | 1.49 | 0.323 | 0.338 | 100.1 | 0.016 |

The light emitting devices according to Examples A-1 to A-3, the light emitting devices according to Examples B-1 to B-5, and the light emitting devices according to Examples C-1 to C-5 each included a translucent thin film that was a single layer having a physical film thickness of 82 nm or more and 140 nm or less, and had a higher light flux than the light emitting device according to Comparative Example a'-1, the light emitting device according to Comparative Example b'-1, and the light emitting device according to Comparative Example c'-1.

The light emitting devices according to Examples A-1 to A-3, the light emitting devices according to Examples B-1 to B-5, and the light emitting devices according to Examples C-1 to C-5 each had an L value of the translucent thin film in a range of 0.82 or more and 1.41 or less, and had a higher relative light flux than the light emitting device according to Comparative Example a'-1, the light emitting device according to Comparative Example b'-1, and the light emitting device according to Comparative Example c'-1, which did not include a translucent thin film. It is considered that in the light emitting devices according to Examples, the second reflected wave generated at the interface between the translucent thin film and the air and the first reflected wave generated at the interface between the ceramic composite and the translucent thin film come close to opposite phases, and the effect of cancelling out the first reflected wave and the second reflected wave by each other is enhanced to reduce the reflection in the wavelength converting member, enabling emission of light having a higher light flux from the light emitting device.

The light emitting devices according to Examples A-1 to A-3 each had an absolute value of a difference Δx of the directional chromaticity of 0.012 or less, and the change in chromaticity of the light emission color of the light emitting device was small even though the directional angle was changed, so as to improve the directional chromaticity characteristics.

The light emitting device according to Comparative Example a'-2, the light emitting device according to Comparative Example b'-2, and the light emitting device according to Comparative Example c'-2 each included the translucent thin film having a physical film thickness exceeding 140 nm, and had an L value exceeding 1.41. It is considered that in the light emitting device according to Comparative Example a'-2, the light emitting device according to Comparative Example b'-2, and the light emitting device according to Comparative Example c'-2, the phases of the second reflected wave generated at the interface between the translucent thin film and the air and the first reflected wave generated at the interface between the ceramic composite and the translucent thin film are deviated from each other, and the effect of cancelling out the first reflected wave and the second reflected wave by each other is reduced to cause reflection in the wavelength converting member, making the relative light flux lower than the light emitting device according to Comparative Example a'-1, the light emitting device according to Comparative Example b'-1, and the light emitting device according to Comparative Example c'-1, which do not include a translucent thin film.

Figure 7:
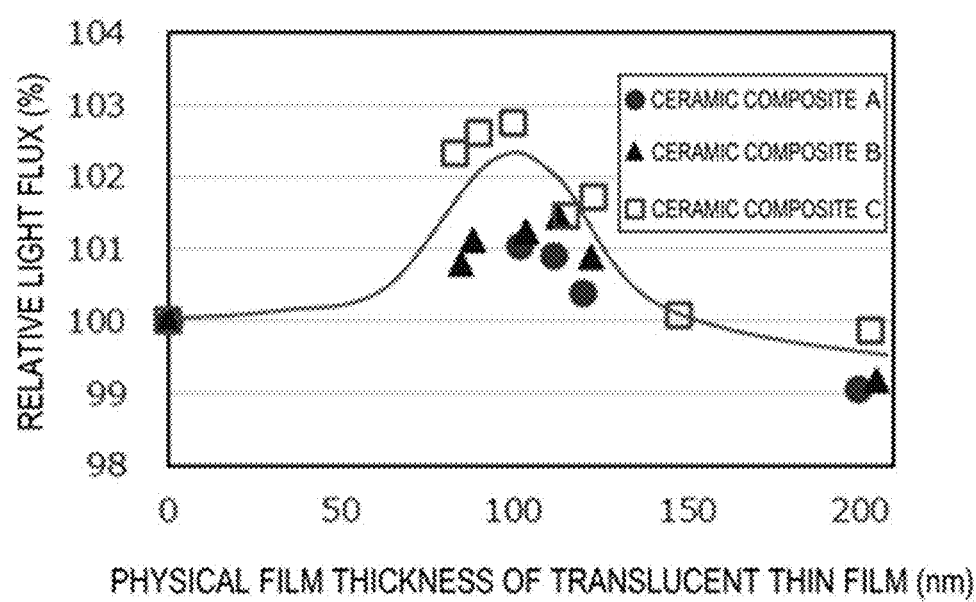
FIG. 7 is a graph showing an exemplary relationship between a physical film thickness of the exemplary translucent thin film and a relative light flux.

FIG. 7 is a graph showing the relationship between the physical film thickness of the translucent thin film and the relative light flux of the light emitting devices of Examples A-1 to A-3, Comparative Examples a'-1 and a'-2, Examples B-1 to B-5, Comparative Examples b'-1 and b'-2, Examples C-1 to C-5, and Comparative Examples c'-1 and c'-2.

As shown in FIG. 7, it is understood that in the case where the physical film thickness of the translucent thin film is in a range of 82 nm or more and 140 nm or less, light having a high relative light flux is emitted from the light emitting device.

Light Emitting Device of Example A-4

The ceramic composite A and magnesium fluoride were placed in a vapor deposition apparatus, and in the state where the pressure inside the vapor deposition apparatus was reduced to $1.0 \times 10^{-4}$ Pa, a translucent thin film ($MgF_2$ film) having a physical film thickness of 299 nm was formed by the resistance heating vapor deposition method with a micro heater on the light emitting plane of the ceramic composite A to be the emission side of light at a temperature of the ceramic composite A in the film formation of 300° C., so as to provide a wavelength converting member A-4 having the physical film thickness. A light emitting device of Example A-4 was produced in the same manner as in Example A-1 except that the wavelength converting member was used. The resulting light emitting device was a light emitting device according to any of the third embodiment to the seventh embodiment.

Light Emitting Device of Example B-6

The ceramic composite B and magnesium fluoride were placed in a vapor deposition apparatus, and in the state where the pressure inside the vapor deposition apparatus was reduced to $1.0 \times 10^{-4}$ Pa, a translucent thin film ($MgF_2$ film) having a physical film thickness of 304 nm was formed by the resistance heating vapor deposition method with a micro heater on the light emitting plane of the ceramic composite B to be the emission side of light at a temperature of the ceramic composite B in the film formation of 300° C., so as to provide a wavelength converting member B-6 having the physical film thickness. A light emitting device of Example B-6 was produced in the same manner as in Example B-1 except that the wavelength converting member was used.

Light Emitting Devices of Examples C-6 to C-11

The ceramic composite C and magnesium fluoride were placed in a vapor deposition apparatus, and in the state where the pressure inside the vapor deposition apparatus was reduced to $1.0 \times 10^{-4}$ Pa, a translucent thin film ($MgF_2$ film) having a physical film thickness of 254 nm, 284 nm, 293 nm, 303 nm, 314 nm, or 325 nm was formed by the resistance heating vapor deposition method with a micro heater on the light emitting plane of the ceramic composite C to be the emission side of light at a temperature of the ceramic composite C in the film formation of 300° C., so as to provide wavelength converting members C-6 to C-11 having the physical film thicknesses. Light emitting devices of Examples C-6 to C-11 were produced in the same manner as in Example C-1 except that these wavelength converting members were used.

Light Emitting Devices of Comparative Examples c'-3 and c'-4

The ceramic composite C and magnesium fluoride were placed in a vapor deposition apparatus, and in the state where the pressure inside the vapor deposition apparatus was reduced to $1.0 \times 10^{-4}$ Pa, a translucent thin film ($MgF_2$ film) having a physical film thickness of 203 nm or 353 nm was formed by the resistance heating vapor deposition method with a micro heater on the light emitting plane of the ceramic composite C to be the emission side of light at a temperature of the ceramic composite C in the film formation of 300° C., so as to provide wavelength converting members c'-3 and c'-4 having the physical film thicknesses. Light emitting devices of Comparative Examples c'-3 and c'-4 were produced in the same manner as in Example C-1 except that these wavelength converting members were used.

Light Emitting Devices of Examples D-1 to D-4

Production of Ceramic Composite D

A rare earth aluminate fluorescent material having a composition represented by $(Y_{0.92}Gd_{0.07}Ce_{0.01})_3Al_5O_{12}$ was prepared as the inorganic fluorescent material.

A ceramic composite D in a plate form having a thickness of 180 μm was obtained in the same manner as in the production of the ceramic composite A except that a raw material mixture obtained by mixing 10% by mass of the rare earth aluminate fluorescent material and 90% by mass of the aluminum oxide particles used in the ceramic composite A was used. The ceramic composite D had a refractive index r1 of 1.76. The refractive index r1 of the ceramic composite D can be obtained from the refractive index of the rare earth aluminate fluorescent material of 1.82, the content thereof of 10% by mass, and the true density thereof of 4.69 $g/cm^3$, the refractive index of aluminum oxide of 1.76, the content thereof of 90% by mass, and the true density thereof of 3.98 $g/cm^3$ in the ceramic composite, according to the expression (6).

Production of Wavelength Converting Member

The ceramic composite D and silicon dioxide were placed in a vapor deposition apparatus, and in the state where the pressure inside the vapor deposition apparatus was reduced to $1.0 \times 10^{-4}$ Pa, a translucent thin film ($SiO_2$ film) having a physical film thickness of 251 nm, 279 nm, 297 nm, or 319 nm was formed by the resistance heating vapor deposition method with a micro heater on the light emitting plane of the ceramic composite D to be the emission side of light at a temperature of the ceramic composite D in the film formation of 300° C., so as to provide wavelength converting members D-1 to D-4 having the physical film thicknesses. The refractive index r2 of the translucent thin film was 1.47, which was the refractive index of $SiO_2$. The refractive index ratio (r1/r2) of the refractive index r1 of the ceramic composite D and the refractive index r2 of the translucent thin film was 1.19.

Production of Light Emitting Device

Light emitting devices of Examples D-1 to D-4 were produced in the same manner as in Example A-1 except that the resulting wavelength converting members D-1 to D-4 were used.

Light Emitting Device of Comparative Example d'-1

A light emitting device of Comparative Example d'-1 was produced in the same manner as in Example D-1 except that the ceramic composite D having no translucent thin film formed thereon (physical film thickness of $SiO_2$ film: 0 nm) was used.

Light Emitting Devices of Comparative Example d'-2 to d'-4

A translucent thin film ($SiO_2$ film) having a physical film thickness of 195 nm, 237 nm, or 347 nm was formed on the ceramic composite D in the same manner as in Example D-1 to provide wavelength converting members d'-2, d'-3, and d'-4. Light emitting devices of Comparative Examples d'-2 to d'-4 were produced in the same manner as in Example D-1 except that the wavelength converting members d'-2, d'-3, and d'-4 were used.

The physical film thickness and the L value of the translucent thin film of the wavelength converting member, and the chromaticity coordinate (x,y), the relative light flux, and the absolute value of the difference Δx of the directional chromaticity of each of the light emitting devices according to Examples and Comparative Examples were measured in the same manner as above. The results are shown in Tables 4 and 5. The chromaticity coordinate (x,y) of the light emission color of each of the light emitting devices means the chromaticity coordinate $(x_\theta, y_\theta)$ at a directional angle of 0°.

TABLE 4

| | Translucent thin film | | Light emitting device | | |
|---|---|---|---|---|---|
| | Physical film thickness | | Chromaticity coordinate | | Difference of directional chromaticity |
| | (nm) | L value | x | y | Δx |
| Example A-4 | 299 | 3.00 | 0.317 | 0.331 | 0.001 |
| Example B-6 | 304 | 3.05 | 0.313 | 0.320 | 0.005 |
| Comparative Example c'-3 | 203 | 2.04 | 0.322 | 0.335 | 0.021 |
| Example C-6 | 254 | 2.55 | 0.317 | 0.327 | 0.011 |
| Example C-7 | 284 | 2.85 | 0.317 | 0.326 | 0.004 |
| Example C-8 | 293 | 2.94 | 0.316 | 0.324 | 0.002 |
| Example C-9 | 303 | 3.04 | 0.319 | 0.331 | 0.004 |
| Example C-10 | 314 | 3.15 | 0.318 | 0.327 | 0.004 |
| Example C-11 | 325 | 3.26 | 0.318 | 0.329 | 0.007 |
| Comparative Example c'-4 | 353 | 3.54 | 0.320 | 0.331 | 0.015 |

TABLE 5

| | Translucent thin film | | Light emitting device | | |
|---|---|---|---|---|---|
| | Physical film thickness | | Chromaticity coordinate | | Difference of directional chromaticity |
| | (nm) | L value | x | y | Δx |
| Comparative Example d'-1 | 0 | 0 | 0.307 | 0.309 | 0.016 |
| Comparative Example d'-2 | 195 | 2.08 | 0.307 | 0.308 | 0.019 |
| Comparative Example d'-3 | 237 | 2.53 | 0.306 | 0.307 | 0.010 |
| Example D-1 | 251 | 2.68 | 0.307 | 0.309 | 0.009 |
| Example D-2 | 279 | 2.98 | 0.303 | 0.302 | 0.007 |
| Example D-3 | 297 | 3.18 | 0.304 | 0.303 | 0.008 |
| Example D-4 | 319 | 3.41 | 0.306 | 0.307 | 0.012 |
| Comparative Example d'-4 | 347 | 3.71 | 0.308 | 0.309 | 0.019 |

The light emitting devices according to Example A-4, Example B-6, Examples C-6 to C-11, and Examples D-1 to D-4 each included a translucent thin film that was a single layer having a physical film thickness of 250 nm or more and 330 nm or less, and the emitted light of each of the light emitting devices had an absolute value of the difference Δx of the directional chromaticity of 0.012 or less, i.e., the difference Δx of the directional chromaticity due to the change in directional angle was small, so as to reduce the change in chromaticity depending on the directional angle, resulting in good directional chromaticity characteristics.

The light emitting devices according to Example A-4, Example B-6, Examples C-6 to C-11, and Examples D-1 to D-4 each had an L value of the translucent thin film in a range of 2.5 or more and 3.5 or less, and the emitted light of each of the light emitting devices had an absolute value of the difference Δx of the directional chromaticity of 0.012 or less, i.e., the difference Δx of the directional chromaticity due to the change in directional angle was small, so as to reduce the change in chromaticity depending on the directional angle, resulting in good directional chromaticity characteristics.

The light emitting devices according to Comparative Example c'-3 and Comparative Examples d'-1 to d'-3 each had a physical film thickness of the translucent thin film of less than 250 nm and an L value of less than 2.5. The light emitting devices of Comparative Example c'-4 and Comparative Example d'-4 each had a physical film thickness of the translucent thin film exceeding 340 nm and an L value exceeding 3.5. The emitted light of each of the light emitting devices of Comparative Examples c'-3 and c'-4 and Comparative Examples d'-1 to d'-4 had an absolute value of the difference Δx of the directional chromaticity exceeding 0.012, i.e., the difference Δx of the directional chromaticity due to the change in directional angle was large, so as to cause the change in chromaticity depending on the directional angle, resulting in inferior directional chromaticity characteristics.

Figure 8:
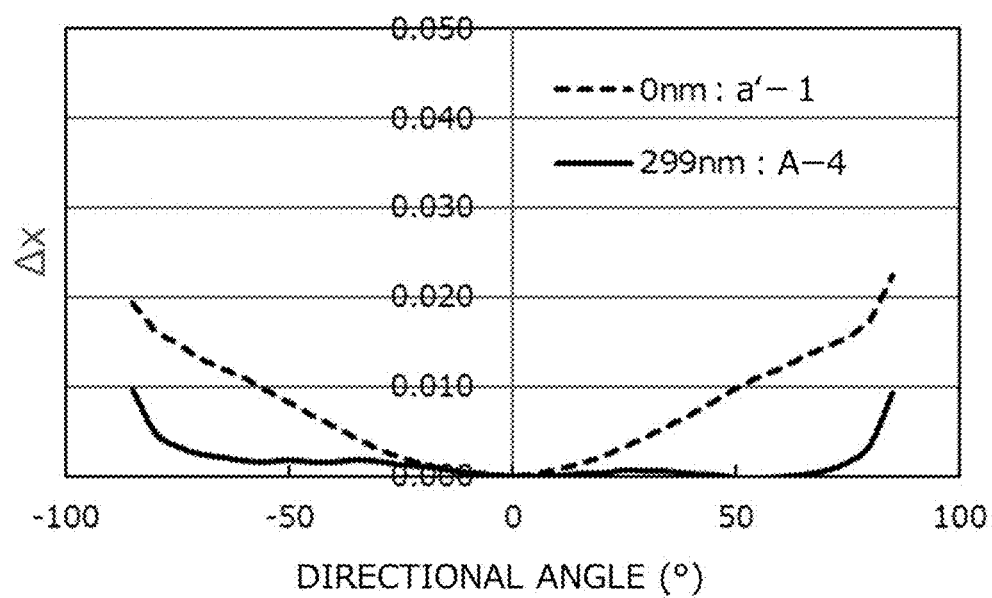
FIG. 8 is a graph showing an exemplary relationship between a directional angle and a difference Δx of a directional chromaticity of the emitted light of the light emitting device according to Example A-4 and the emitted light of the light emitting device according to Comparative Example a'-1.
Figure 9:
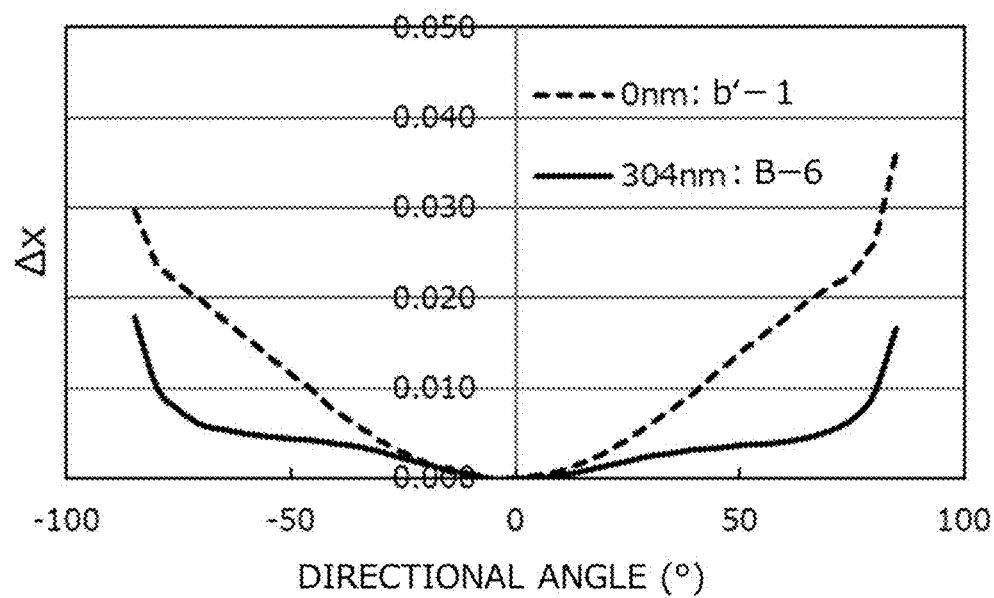
FIG. 9 is a graph showing an exemplary relationship between the directional angle and the difference Δx of the directional chromaticity of the emitted light of the light emitting device according to Example B-6 and the emitted light of the light emitting device according to Comparative Example b'-1.
Figure 10:
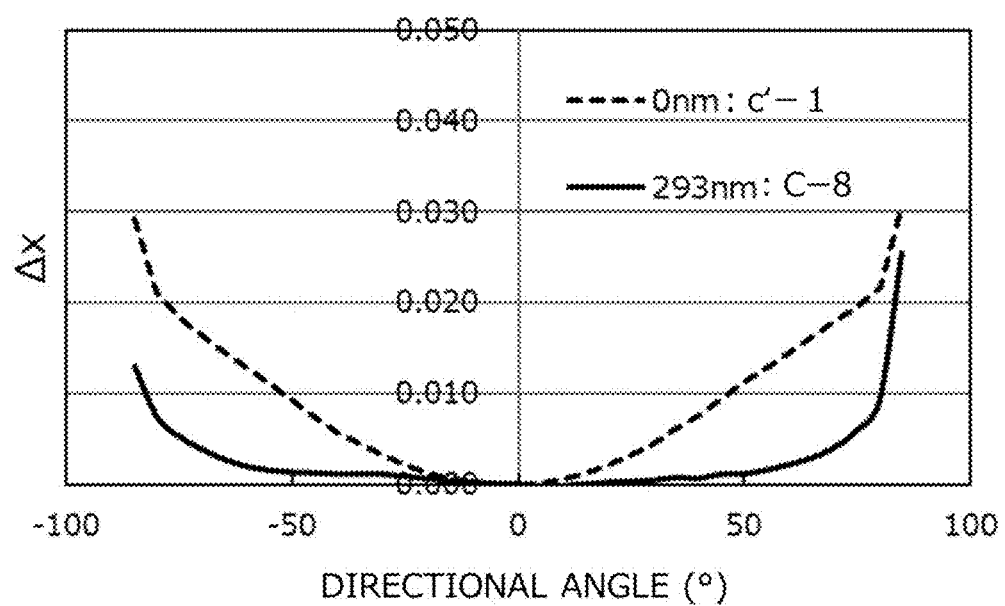
FIG. 10 is a graph showing an exemplary relationship between the directional angle and the difference Δx of the directional chromaticity of the emitted light of the light emitting device according to Example C-8 and the emitted light of the light emitting device according to Comparative Example c'-1.
Figure 11:
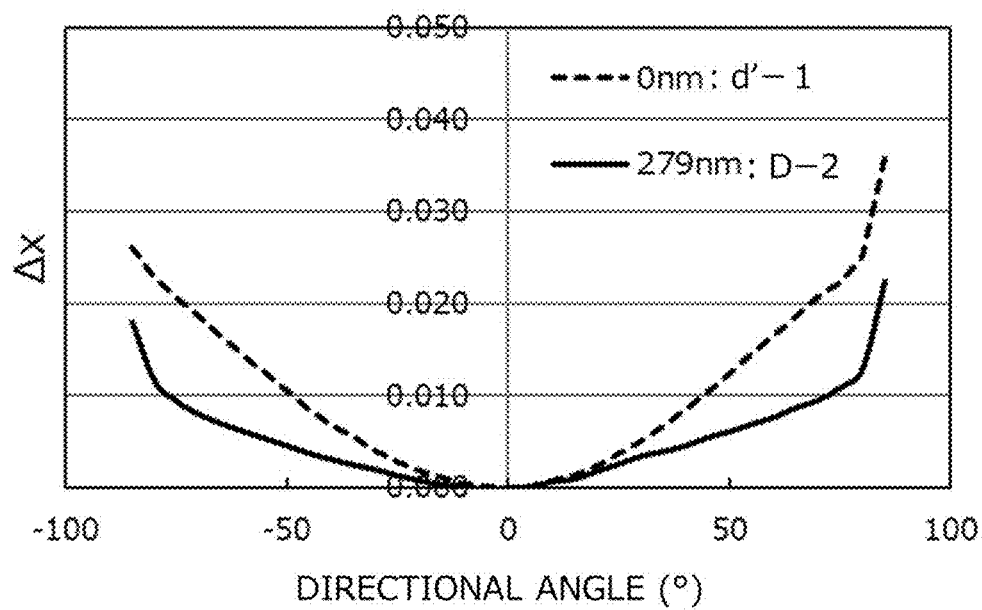
FIG. 11 is a graph showing an exemplary relationship between the directional angle and the difference Δx of the directional chromaticity of the emitted light of the light emitting device according to Example D-2 and the emitted light of the light emitting device according to Comparative Example d'-1.

FIG. 8 is a graph showing the relationship between the directional angle and the difference Δx of the directional chromaticity of the emitted light of the light emitting device according to Example A-4 having a physical film thickness of the translucent thin film of 299 nm and the emitted light of the light emitting device according to Comparative Example a'-1 having a physical film thickness of the translucent thin film of 0 nm. FIG. 9 is a graph showing the relationship between the directional angle and the difference Δx of the directional chromaticity of the emitted light of the light emitting device according to Example B-6 having a physical film thickness of the translucent thin film of 304 nm and the emitted light of the light emitting device according to Comparative Example b'-1 having a physical film thickness of the translucent thin film of 0 nm. FIG. 10 is a graph showing the relationship between the directional angle and the difference Δx of the directional chromaticity of the emitted light of the light emitting device according to Example C-8 having a physical film thickness of the translucent thin film of 293 nm and the emitted light of the light emitting device according to Comparative Example c'-1 having a physical film thickness of the translucent thin film of 0 nm. FIG. 11 is a graph showing the relationship between the directional angle and the difference Δx of the directional chromaticity of the emitted light of the light emitting device according to Example D-2 having a physical film thickness of the translucent thin film of 279 nm and the emitted light of the light emitting device according to Comparative Example d'-1 having a physical film thickness of the translucent thin film of 0 nm. As shown in FIGS. 8 to 11, emitted light of the light emitting devices according to Examples had a small change of the difference Δx of the directional chromaticity of the light emission color depending on the change in directional angle even though the directional angle was changed from 0° to +600 or −60°, and the graph showing the relationship between the directional angle and the difference Δx of the directional chromaticity became a curved line near a horizontal straight line, even though the directional angle increased resulting in good directional chromaticity characteristics.

Transmittance

For the light emitting device according to Example C-6 having a physical film thickness of the translucent thin film of 254 nm, the light emitting device according to Example C-7 having a physical film thickness of the translucent thin film of 284 nm, the light emitting device according to Example C-9 having a physical film thickness of the translucent thin film of 303 nm, the light emitting device according to Example C-11 having a physical film thickness of the translucent thin film of 325 nm, and the light emitting device according to Comparative Example c'-4 having a physical film thickness of the translucent thin film of 353 nm, the transmittances $T_{C-0}$, $T_{C-30}$, $T_{C-45}$, and $T_{C-60}$ at the light emission peak wavelength (450 nm) of the light emitting element and the transmittances $T_{P-0}$, $T_{P-30}$, $T_{P-45}$, and $T_{P-60}$ at the light emission peak wavelength (550 nm) of the rare earth aluminate fluorescent material at a directional angle of 0°, +30° and −30°, +45° and −45°, and +60° and −60° were obtained with a thin film calculation software (Essential Macleod, manufactured by Thin Film Center, Inc.). The first transmittance difference T1, the second transmittance difference T2, and the third transmittance difference T3 were obtained by the following expressions (3) to (5). The results are shown in Table 6 along with the difference Δx between the x coordinate $x_0$ at a directional angle of 0° and the x coordinate $x_{60}$, which is the average value of x coordinates at a directional angle of +60° and a directional angle of −60° according to Examples and Comparative Examples.

$$T1 = T_{C-60} - T_{P-60} - (T_{C-0} - T_{P-0}) \quad (3)$$

$$T2 = T_{C-0} - T_{P-0} - (T_{C-0} - T_{P-0}) \quad (4)$$

$$T3 = T_{C-45} - T_{P-45} - (T_{C-0} - T_{P-0}) \quad (5)$$

$T_{C-60}$: Average value of transmittances at the light emission peak wavelength of 450 nm of the light emitting element at a directional angle of +60° and a directional angle of −60°
$T_{P-60}$: Average value of transmittances at the light emission peak wavelength of 550 nm of the rare earth aluminate fluorescent material at a directional angle of +600 and a directional angle of −60°
$T_{C-30}$: Average value of transmittances at the light emission peak wavelength of 450 nm of the light emitting element at a directional angle of +300 and a directional angle of −30°
$T_{P-30}$: Average value of transmittances at the light emission peak wavelength of 550 nm of the rare earth aluminate fluorescent material at a directional angle of +300 and a directional angle of −30°
$T_{C-45}$: Average value of transmittances at the light emission peak wavelength of 450 nm of the light emitting element at a directional angle of +450 and a directional angle of −45°
$T_{P-45}$: Average value of transmittances at the light emission peak wavelength of 550 nm of the rare earth aluminate fluorescent material at a directional angle of +45° and a directional angle of −45°

$T_{C-0}$: Transmittance at the light emission peak wavelength of 450 nm of the light emitting element at a directional angle of 0°

$T_{P-0}$: Transmittance at the light emission peak wavelength of 550 nm of the rare earth aluminate fluorescent material at a directional angle of 0°

TABLE 6

| | Physical film thickness (nm) | Light emission peak wavelength (nm) | Transmittance | | | | $T_C-T_P$ (450 nm-550 nm) | | | |
|---|---|---|---|---|---|---|---|---|---|---|
| | film | peak | 0° | 30° | 45° | 60° | 0° | 30° | 45° | 60° |
| Example C-6 | 254 | 450 | 99.7 | 99.5 | 97.0 | 90.1 | 3.6 | 5.3 | 5.2 | 2.5 |
| | | 550 | 96.1 | 94.2 | 91.8 | 87.6 | | | | |
| Example C-7 | 284 | 450 | 96.4 | 98.8 | 99.4 | 94.7 | −2.8 | 1.4 | 5.1 | 6.2 |
| | | 550 | 99.2 | 97.4 | 94.3 | 88.5 | | | | |
| Example C-9 | 303 | 450 | 93.9 | 96.3 | 98.6 | 96.7 | −5.9 | −2.9 | 2.1 | 6.8 |
| | | 550 | 99.8 | 99.1 | 96.5 | 89.9 | | | | |
| Example C-11 | 325 | 450 | 92.3 | 92.7 | 94.8 | 96.1 | −5.7 | −6.8 | −4.2 | 2.5 |
| | | 550 | 98.0 | 99.6 | 99.0 | 93.6 | | | | |
| Comparative Example c'-4 | 353 | 450 | 93.8 | 92.0 | 92.4 | 93.4 | −1.9 | −6.1 | −7.0 | −2.5 |
| | | 550 | 95.7 | 98.2 | 99.4 | 95.9 | | | | |

| | First transmittance difference T1 (%) | Second transmittance difference T2 (%) | Third transmittance difference T3 (%) | Difference Δx of directional chromaticity |
|---|---|---|---|---|
| Example C-6 | −1.1 | 1.7 | 1.6 | 0.011 |
| Example C-7 | 9.0 | 4.2 | 7.9 | 0.004 |
| Example C-9 | 12.7 | 3.0 | 8.1 | 0.004 |
| Example C-11 | 8.2 | −1.2 | 1.5 | 0.007 |
| Comparative Example c'-4 | −0.6 | −4.3 | −5.1 | 0.015 |

The light emitting devices according to Examples C-6, C-7, C-9, and C-11 each emitted light satisfying a first transmittance difference T1 in a range of 0% or more and 25% or less, a second transmittance difference T2 in a range of −3% or more and 10% or less, and a third transmittance difference T3 in a range of 0% or more and 20% or less. The emitted light of each of the light emitting devices according to Examples C-6, C-7, C-9, and C-11 had an absolute value of the difference Δx of the directional chromaticity of 0.012 or less, i.e., the difference Δx of the directional chromaticity was small, so as to reduce the change in chromaticity depending on the directional angle, resulting in good directional chromaticity characteristics.

The light emitting device according to Comparative Example c'-4 emitted light having a first transmittance difference T1 of less than 0%, a second transmittance difference T2 of less than −3%, and a third transmittance difference T3 of less than 0%. The emitted light of the light emitting device according to Comparative Example c'-4 had an absolute value of the difference Δx of the directional chromaticity exceeding 0.012, resulting in inferior directional chromaticity characteristics.

Figure 12:
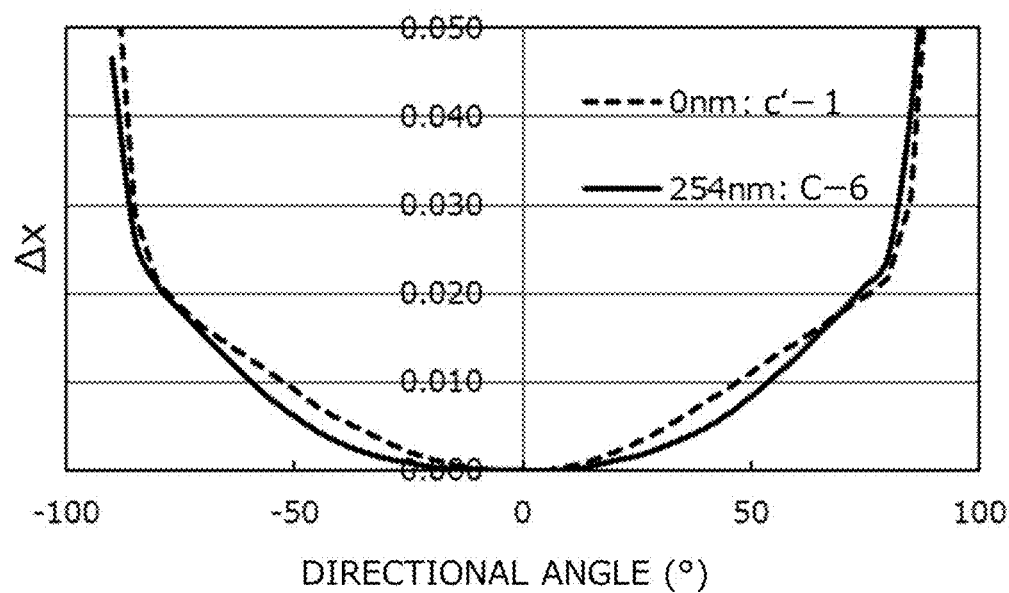
FIG. 12 is a graph showing an exemplary relationship between the directional angle and the difference Δx of the directional chromaticity of the emitted light of the light emitting device according to Example C-6 and the emitted light of the light emitting device according to Comparative Example c'-1.
Figure 13:
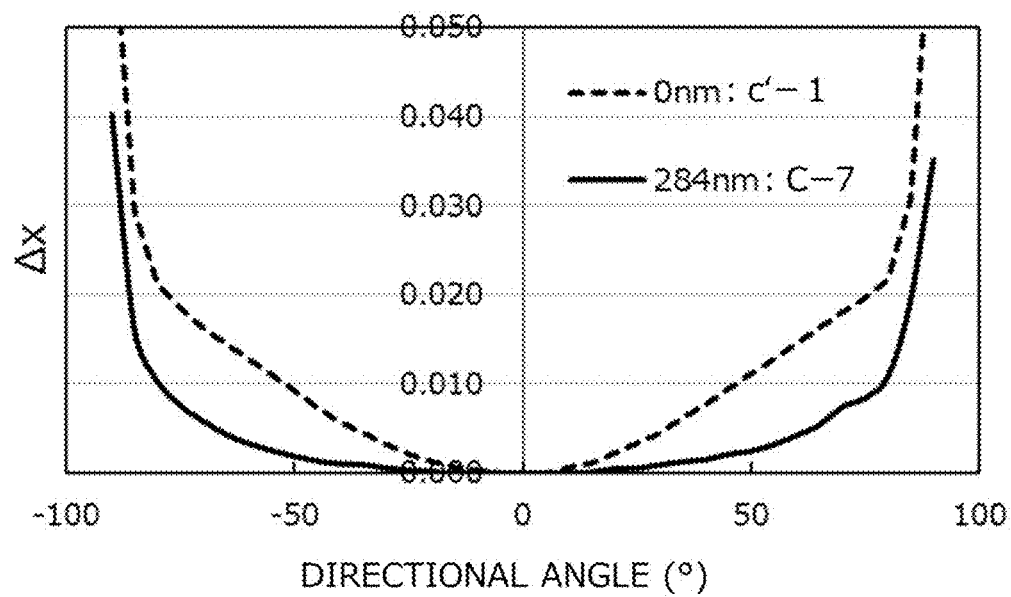
FIG. 13 is a graph showing an exemplary relationship between the directional angle and the difference Δx of the directional chromaticity of the emitted light of the light emitting device according to Example C-7 and the emitted light of the light emitting device according to Comparative Example c'-1.
Figure 14:
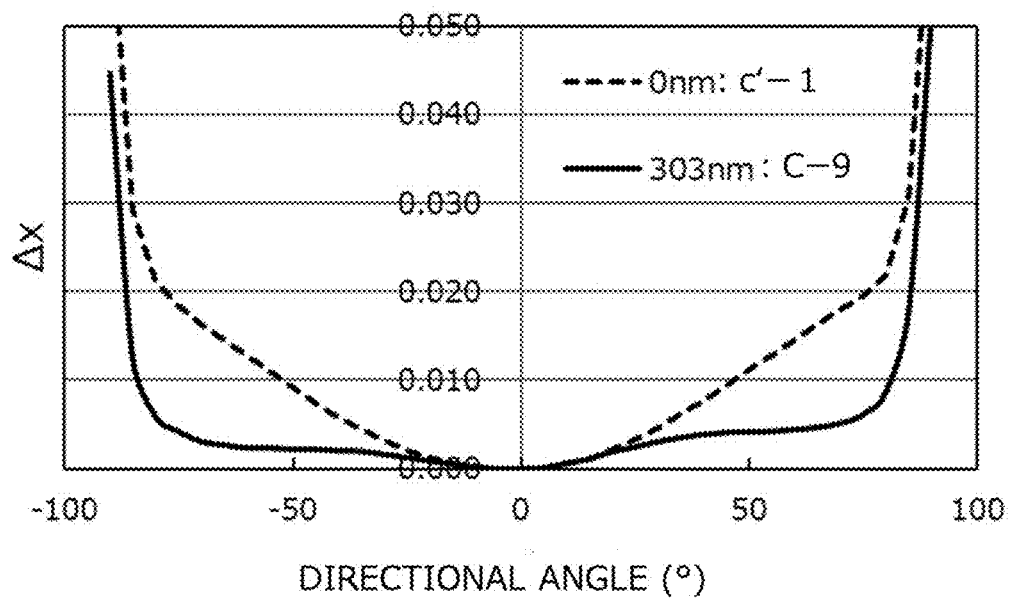
FIG. 14 is a graph showing an exemplary relationship between the directional angle and the difference Δx of the directional chromaticity of the emitted light of the light emitting device according to Example C-9 and the emitted light of the light emitting device according to Comparative Example c'-1.
Figure 15:
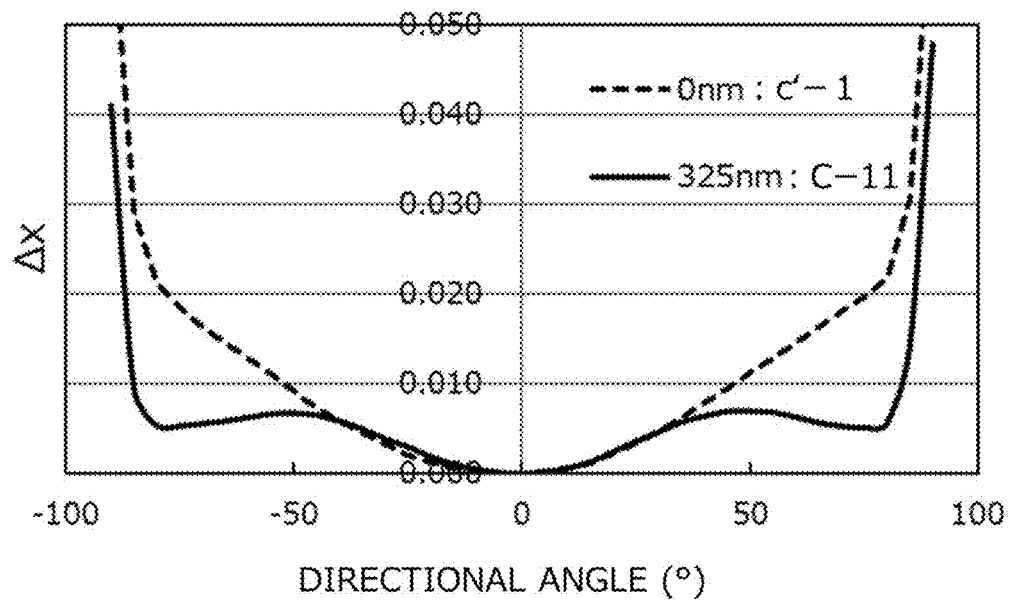
FIG. 15 is a graph showing an exemplary relationship between the directional angle and the difference Δx of the directional chromaticity of the emitted light of the light emitting device according to Example C-11 and the emitted light of the light emitting device according to Comparative Example c'-1.
Figure 16:
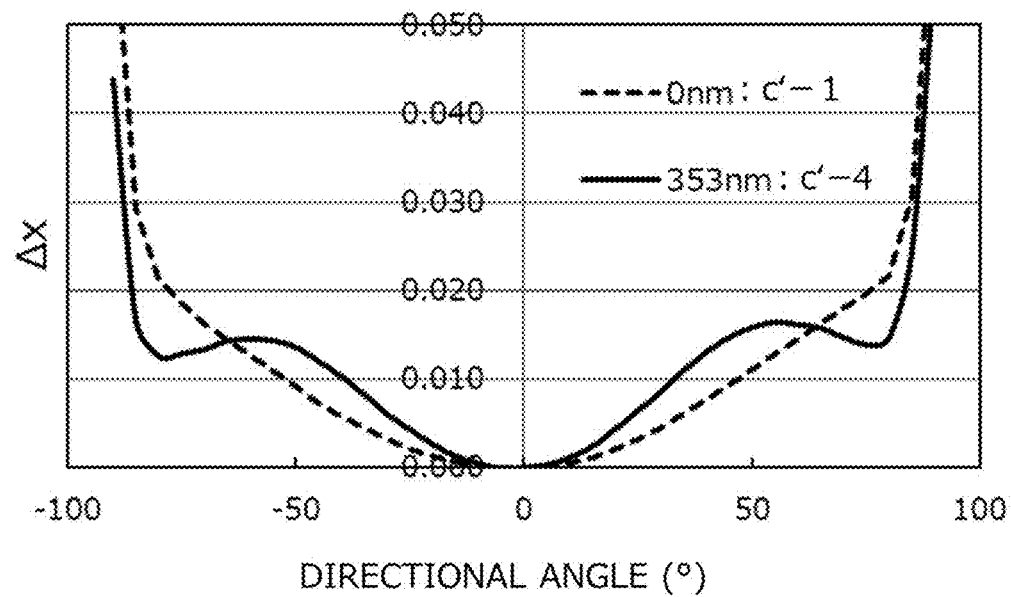
FIG. 16 is a graph showing an exemplary relationship between the directional angle and the difference Δx of the directional chromaticity of the emitted light of the light emitting device according to Comparative Example c'-1 and the emitted light of the light emitting device according to Comparative Example c'-4.

FIG. 12 is a graph showing the relationship between the directional angle and the difference Δx of the directional chromaticity of the emitted light of the light emitting device according to Example C-6 having a physical film thickness of the translucent thin film of 254 nm and the emitted light of the light emitting device according to Comparative Example c'-1 having a physical film thickness of the translucent thin film of 0 nm. FIG. 13 is a graph showing the relationship between the directional angle and the difference Δx of the directional chromaticity of the emitted light of the light emitting device according to Example C-7 having a physical film thickness of the translucent thin film of 284 nm and the emitted light of the light emitting device according to Comparative Example c'-1 having a physical film thickness of the translucent thin film of 0 nm. FIG. 14 is a graph showing the relationship between the directional angle and the difference Δx of the directional chromaticity of the emitted light of the light emitting device according to Example C-9 having a physical film thickness of the translucent thin film of 303 nm and the emitted light of the light emitting device according to Comparative Example c'-1 having a physical film thickness of the translucent thin film of 0 nm. FIG. 15 is a graph showing the relationship between the directional angle and the difference Δx of the directional chromaticity of the emitted light of the light emitting device according to Example C-11 having a physical film thickness of the translucent thin film of 325 nm and the emitted light of the light emitting device according to Comparative Example c'-1 having a physical film thickness of the translucent thin film of 0 nm. FIG. 16 is a graph showing the relationship between the directional angle and the difference Δx of the directional chromaticity of the emitted light of the light emitting device according to Comparative Example c'-1 having a physical film thickness of the translucent thin film of 0 nm and the emitted light of the light emitting device according to Comparative Example c'-4 having a physical film thickness of the translucent thin film of 353 nm.

As shown in FIGS. 12 to 15, emitted light of the light emitting devices according to Examples had a small change of the difference Δx of the directional chromaticity even when the directional angle was changed from 0° to +600 or −60°. As shown in FIGS. 13 to 15, emitted light of the light emitting device according to Example C-7, emitted light of the light emitting device according to Example C-9, and emitted light of the light emitting device according to Example C-11 having a first transmittance difference of 8% or more and 15% or less had a small difference Δx of the directional chromaticity, and the graph showing the relationship between the directional angle and the difference Δx of the directional chromaticity became a curved line near a horizontal straight line even though the directional angle is increased, resulting in good directional chromaticity characteristics.

As shown in FIG. 16, emitted light of the light emitting device according to Comparative Example had a large change of the difference Δx of the directional chromaticity when the directional angle was changed from 0° to +60° or −60°, resulting in inferior directional chromaticity characteristics.

The light emitting device according to the present disclosure can be applied to a light source for automobile use, general illumination use, a backlight of a liquid crystal display device, a projector.

The invention claimed is:

1. A light emitting device comprising a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material having a light emission peak wavelength in a range of 510 nm or more and 570 nm or less and an inorganic oxide, and
  a translucent thin film having a refractive index smaller than a refractive index of the ceramic composite, disposed on a light emission side of the ceramic composite,
  the translucent thin film being a single layer having a physical film thickness in a range of 250 nm or more and 330 nm or less,
  the translucent thin film including silicon dioxide or a fluoride, wherein the fluoride contains at least one kind of an element selected from the group consisting of an alkali metal element, an alkaline earth metal element, and a Group 13 metal element.

2. A light emitting device comprising a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material and an inorganic oxide, and
  a translucent thin film having a refractive index smaller than a refractive index of the ceramic composite, disposed on a light emission side of the ceramic composite,
  the translucent thin film being a single layer including silicon dioxide or a fluoride, wherein the fluoride contains at least one kind of an element selected from the group consisting of an alkali metal element, an alkaline earth metal element, and a Group 13 metal element,
  the translucent thin film having an L value calculated by the expression (2), which is a ratio of a physical film thickness $L_1$ of the translucent thin film with respect to an optical film thickness $L_0$ of the translucent thin film calculated by the expression (1), in a range of 2.5 or more and 3.5 or less:

$L_0$=light emission peak wavelength($\lambda$)(nm) of inorganic fluorescent material/(4×refractive index of translucent thin film)    (1)

$L$=physical film thickness $L_1$ (nm) of translucent thin film/$L_0$    (2).

3. A light emitting device comprising a light emitting element having a light emission peak wavelength in a range of 380 nm or more and 500 nm or less, and
  a wavelength converting member having a light emitting plane, disposed on a light emission side of the light emitting element,
  the wavelength converting member including a ceramic composite including an inorganic fluorescent material having a light emission peak wavelength in a range of 510 nm or more and 570 nm or less and an inorganic oxide, and
  a translucent thin film having a refractive index smaller than a refractive index of the ceramic composite, disposed on a light emission side of the ceramic composite,
  the translucent thin film including silicon dioxide or a fluoride, wherein the fluoride contains at least one kind of an element selected from the group consisting of an alkali metal element, an alkaline earth metal element, and a Group 13 metal element,
  the light emitting device emitting light satisfying at least one of a first transmittance difference T1 calculated based on the following expression (3) in a range of 0% or more and 25% or less and a second transmittance difference T2 calculated based on the following expression (4) in a range of −3% or more and 10% or less:

$$T1 = T_{C\text{-}60} - T_{P\text{-}60} - (T_{C\text{-}0} - T_{P\text{-}0}) \tag{3}$$

$$T2 = T_{C\text{-}30} - T_{P\text{-}30} - (T_{C\text{-}0} - T_{P\text{-}0}) \tag{4}$$

wherein in the expression (3), $T_{C\text{-}60}$ represents an average value of transmittances of transmitted light from the light emitting plane of the wavelength converting member at a light emission peak wavelength of the light emitting element at a directional angle of +60° and a directional angle of −60°, and $T_{P\text{-}60}$ represents an average value of transmittances of transmitted light from the light emitting plane of the wavelength converting member at a light emission peak wavelength of the inorganic fluorescent material at a directional angle of +60° and a directional angle of −60°; in the expression (4), $T_{C\text{-}30}$ represents an average value of transmittances of transmitted light from the light emitting plane of the wavelength converting member at a light emission peak wavelength of the light emitting element at a directional angle of +30° and a directional angle of −30°, and $T_{P\text{-}30}$ represents an average value of transmittances of transmitted light from the light emitting plane of the wavelength converting member at a light emission peak wavelength of the inorganic fluorescent material at a directional angle of +30° and a directional angle of −30°; and in the expressions (3) and (4), $T_{C\text{-}0}$ represents a transmittance of transmitted light from the light emitting plane of the wavelength converting member at a light emission peak wavelength of the light emitting element at a directional angle of 0°, and $T_{P\text{-}0}$ represents a transmittance of transmitted light from the light emitting plane of the wavelength converting member at a light emission peak wavelength of the inorganic fluorescent material at a directional angle of 0°, wherein a directional angle of 0° is an angle perpendicular to the light emitting plane, directional angles of +60° and −60° are angles inclined from the angle perpendicular to the light emitting plane toward the light emitting plane by +60° and −60°, respectively, with a directional angle of 0° as center, and directional angles of +30° and −30° are angles inclined from the angle perpendicular to the light emitting plane toward the light emitting plane by +30° and −30°, respectively, with a directional angle of 0° as center.

4. A light emitting device comprising a light emitting element having a light emission peak wavelength in a range of 380 nm or more and 500 nm or less, and
   a wavelength converting member having a light emitting plane, disposed on a light emission side of the light emitting element,
   the wavelength converting member including a ceramic composite including an inorganic fluorescent material having a light emission peak wavelength in a range of 510 nm or more and 570 nm or less and an inorganic oxide, and
   a translucent thin film having a refractive index smaller than a refractive index of the ceramic composite, disposed on a light emission side of the ceramic composite,
   the translucent thin film being a single layer including silicon dioxide or a fluoride, wherein the fluoride contains at least one kind of an element selected from the group consisting of an alkali metal element, an alkaline earth metal element, and a Group 13 metal element,
   the light emitting device having an absolute value of a difference Δx of 0.012 or less between, in a chromaticity coordinate according to the CIE 1931 chromaticity diagram, an x coordinate $x_0$ of light emission color of the light emitting device at a directional angle of 0° and an x coordinate $x_{60}$, which is an average value of x coordinates of light emission color of the light emitting device at a directional angle of +60° and a directional angle of −60°, which are angles inclined from an angle perpendicular to the light emitting plane toward the light emitting plane by +60° and −60°, respectively, with a directional angle of 0° as center.

* * * * *